(12) United States Patent
Ozeki

(10) Patent No.: US 11,733,577 B2
(45) Date of Patent: Aug. 22, 2023

(54) DISPLAY DEVICE AND ARRAY SUBSTRATE OF DISPLAY DEVICE

(71) Applicant: Japan Display Inc., Tokyo (JP)

(72) Inventor: Yoshitaka Ozeki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/704,161

(22) Filed: Mar. 25, 2022

(65) Prior Publication Data

US 2022/0308378 A1    Sep. 29, 2022

(30) Foreign Application Priority Data

Mar. 29, 2021 (JP) ................................. 2021-056030
Feb. 9, 2022 (JP) ................................. 2022-018752

(51) Int. Cl.
| | | |
|---|---|---|
| *G02F 1/1368* | (2006.01) | |
| *H01L 27/12* | (2006.01) | |
| *H01L 29/786* | (2006.01) | |
| *G02F 1/1343* | (2006.01) | |
| *G02F 1/1333* | (2006.01) | |
| *G02F 1/1362* | (2006.01) | |

(52) U.S. Cl.
CPC ........ *G02F 1/1368* (2013.01); *G02F 1/13439* (2013.01); *G02F 1/133345* (2013.01); *G02F 1/134336* (2013.01); *G02F 1/136209* (2013.01); *H01L 27/124* (2013.01); *H01L 27/1225* (2013.01); *H01L 29/7869* (2013.01); *H01L 29/78633* (2013.01); *G02F 2201/52* (2013.01)

(58) Field of Classification Search
None
See application file for complete search history.

(56) References Cited

U.S. PATENT DOCUMENTS

| | | | | |
|---|---|---|---|---|
| 6,593,592 B1 * | 7/2003 | Yamazaki | ......... | H01L 29/78621 257/E27.111 |
| 7,462,866 B2 * | 12/2008 | Yamazaki | ......... | H01L 29/78675 438/149 |
| 8,896,777 B2 * | 11/2014 | Yamazaki | ......... | H01L 29/78645 349/138 |

(Continued)

FOREIGN PATENT DOCUMENTS

| | | |
|---|---|---|
| JP | 2014-146819 A | 8/2014 |
| JP | 2015-159315 A | 9/2015 |

*Primary Examiner* — Ryan Crockett
(74) *Attorney, Agent, or Firm* — K&L Gates LLP

(57) ABSTRACT

A display device includes a plurality of pixels arranged in a matrix on a substrate along a first direction and a second direction intersecting the first direction. Each of the plurality of pixels includes a transistor, a first transparent electrode located over the transistor and electrically connected to the transistor, a second transparent electrode located over the first transparent electrode and electrically connected to the first transparent electrode via an opening, an insulating layer located over the second transparent electrode, a third transparent electrode located over the insulating layer; and a metal layer in contact with the third transparent electrode. The opening overlaps a gate electrode of the transistor. At least a part of the metal layer is provided in the opening and overlaps the gate electrode. The metal layer extends along the first direction and is commonly provided in the pixels arranged in the first direction.

23 Claims, 24 Drawing Sheets

(56) References Cited

U.S. PATENT DOCUMENTS

| | | | |
|---|---|---|---|
| 2004/0257489 A1* | 12/2004 | Gotoh | G02F 1/136209 |
| | | | 257/E27.113 |
| 2011/0058116 A1* | 3/2011 | Yamazaki | H01L 27/1225 |
| | | | 438/34 |
| 2014/0184964 A1* | 7/2014 | Byeon | G02F 1/133514 |
| | | | 349/138 |
| 2016/0148950 A1* | 5/2016 | Xu | H01L 29/78633 |
| | | | 438/158 |
| 2018/0031877 A1* | 2/2018 | Li | G02F 1/136209 |
| 2019/0056620 A1* | 2/2019 | Akiyoshi | H01L 27/124 |
| 2019/0317345 A1* | 10/2019 | Ito | H01L 29/78621 |
| 2021/0036031 A1* | 2/2021 | Nakamura | G02F 1/136204 |
| 2021/0356787 A1* | 11/2021 | Mochizuki | H01L 27/14627 |
| 2021/0373395 A1* | 12/2021 | Okuyama | G02F 1/136222 |

* cited by examiner

DISPLAY DEVICE AND ARRAY SUBSTRATE OF DISPLAY DEVICE

CROSS REFERENCE TO RELATED APPLICATIONS

This application is based on and claims the benefit of priority from the prior Japanese Patent Application No. 2021-56030, filed on Mar. 29, 2021, and the prior Japanese Patent Application No. 2022-018752, filed on Feb. 9, 2022, the entire contents of which are incorporated herein by reference.

BACKGROUND OF THE INVENTION

Field

One embodiment of the present invention relates to a display device. In particular, one embodiment of the present invention relates to a display device in which a transistor including an oxide semiconductor is used. Further, one embodiment of the present invention relates to an array substrate of a display device.

Description of the Related Art

Recently, a transistor using an oxide semiconductor as a channel has been developed in place of an amorphous silicon, a low-temperature polysilicon, and a single-crystal silicon (e.g., Japanese laid-open patent publication No. 2014-146819 and Japanese laid-open patent publication No. 2015-159315). The transistor using the oxide semiconductor as the channel is formed in a simple-structured, low-temperature process similar to a transistor using an amorphous silicon as a channel. It is known that the transistor using the oxide semiconductor as the channel has higher mobility than the transistor using the amorphous silicon as the channel and has a very low off-current.

SUMMARY OF THE INVENTION

A display device according to an embodiment of the present invention includes a plurality of pixels arranged in a matrix on a substrate along a first direction and a second direction intersecting the first direction. Each of the plurality of pixels includes a transistor, a first transparent electrode located over the transistor and electrically connected to the transistor, a second transparent electrode located over the first transparent electrode and electrically connected to the first transparent electrode via an opening, an insulating layer located over the second transparent electrode, a third transparent electrode located over the insulating layer, and a metal layer in contact with the third transparent electrode. The opening overlaps a gate electrode of the transistor. At least a part of the metal layer is provided in the opening and overlaps the gate electrode. The metal layer extends along the first direction and is commonly provided in the pixels arranged in the first direction.

An array substrate of a display device according to an embodiment of the present invention includes a plurality of pixel circuits arranged in a first direction on a substrate. Each of the plurality of pixel circuits includes a transistor, a first transparent electrode located over the transistor and electrically connected to the transistor, a second transparent electrode located over the first transparent electrode and electrically connected to the first transparent electrode via an opening, an insulating layer located over the second transparent electrode, a third transparent electrode located over the insulating layer, and a metal layer in contact with the third transparent electrode. The metal layer extends along the first direction in a plan view and passes over an opening of adjacent pixel circuits.

DESCRIPTION OF EMBODIMENTS

Figure 1:
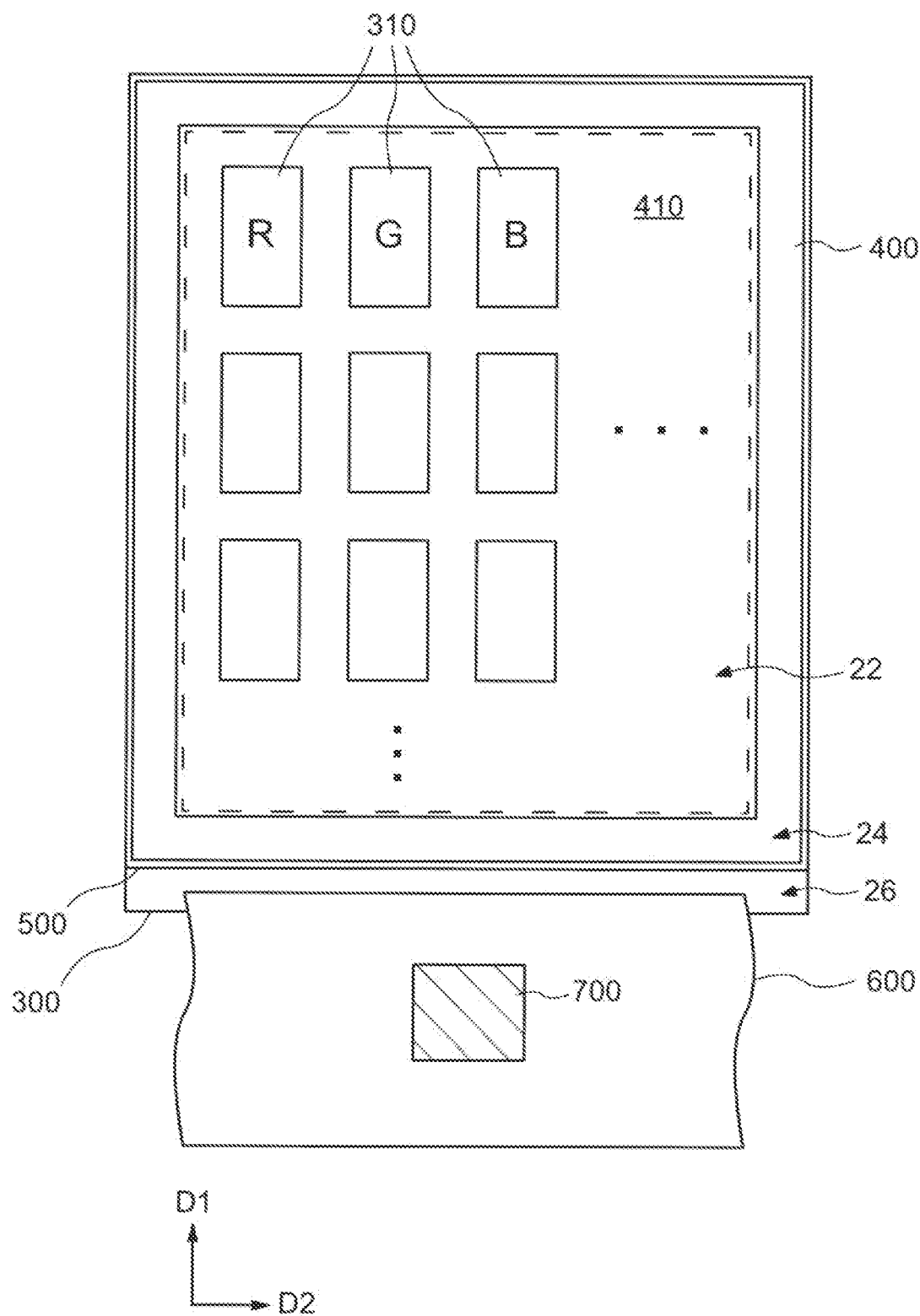
FIG. 1 is a plan view showing an outline of a display device according to an embodiment of the present invention.

In a display device such as a head-mounted display, high-definition display with an increased number of pixels are desired. When the number of pixels is increased (higher definition), it is necessary to reduce the width of the electrode or wiring in order to maintain the aperture ratio. However, the reduction of the electrode or the wiring leads to an increase of the resistance of the electrode or the wiring. In particular, in the transparent electrode having higher resistance than the metal electrode, the voltage drop due to the high resistance is remarkable. Further, the oxide semiconductor has a problem that its characteristics are changed by light irradiation.

In view of the above problems, it is one object of an embodiment of the present invention to provide a display device in which light irradiation to an oxide semiconductor is suppressed and a time constant of a common electrode is reduced. Further, it is one object of an embodiment of the present invention to provide an array substrate of the display device.

Hereinafter, embodiments of the present invention is described with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as upper or above. On the contrary, a direction from the oxide semiconductor layer to the substrate is referred to as lower or below. As described above, for convenience of explanation, although the phrase "above" or "below" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, and when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later are described by exemplifying the liquid crystal display device including a liquid crystal layer as the display device, the structure in the present embodiment can be applied to a display device including the other electro-optical layers described above.

The expressions "a includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where a includes other elements.

The following embodiments may be combined with each other as long as there is no technical contradiction.

First Embodiment

[1. Outline of Display Device 10]

An outline of a display device 10 according to an embodiment of the present invention is described with reference to FIGS. 1 to 3. FIG. 1 is a plan view showing an outline of a display device according to an embodiment of the present invention. As shown in FIG. 1, a display device 10 includes an array substrate 300B, a seal part 400, a counter substrate 500, a flexible printed circuit substrate 600 (FPC 600), and an IC chip 700. The array substrate 300 and the counter substrate 500 are bonded by the seal part 400. In the liquid crystal region 22 surrounded by the seal portion 400, a plurality of pixels 310 are arranged in a matrix along the first direction D1 (column direction) and the second direction D2 (row direction) intersecting the first direction D1. The plurality of pixels 310 include a red pixel R, a green pixel G, and a blue pixel B according to a color filter provided on the facing substrate. The first direction D1 and the second direction D2 may be orthogonal to each other. The liquid crystal region 22 is a region that overlaps the liquid crystal element 410 described later in a plan view. In the following description, the area including a plurality of pixels in the liquid crystal area 22 may be referred to as an image display area.

Further, the display device 10 has a backlight unit on the back of the array substrate 300, and when the light emitted from the backlight unit passes through the image display area, the transmitted light is modulated in each pixel 310 to display an image.

A seal area 24 provided with the seal part 400 is an area around the liquid crystal area 22. The FPC 600 is provided in a terminal area 26. The terminal area 26 is an area where the array substrate 300 is exposed from the counter substrate 500 and provided outside the seal area 24. The outside of the seal area 24 means outside of the area provided with the seal part 400 and the area surrounded by the seal part 400. The IC chip 700 is provided on the FPC 600. The IC chip 700 supplies a signal for driving the pixel circuit of each of the plurality of pixels 310. In the following description, the seal area 24, the outside of the seal area 24, and the terminal area 26 may be collectively referred to as a frame area

[2. Circuit Configuration of Display Device 10]

Figure 2:
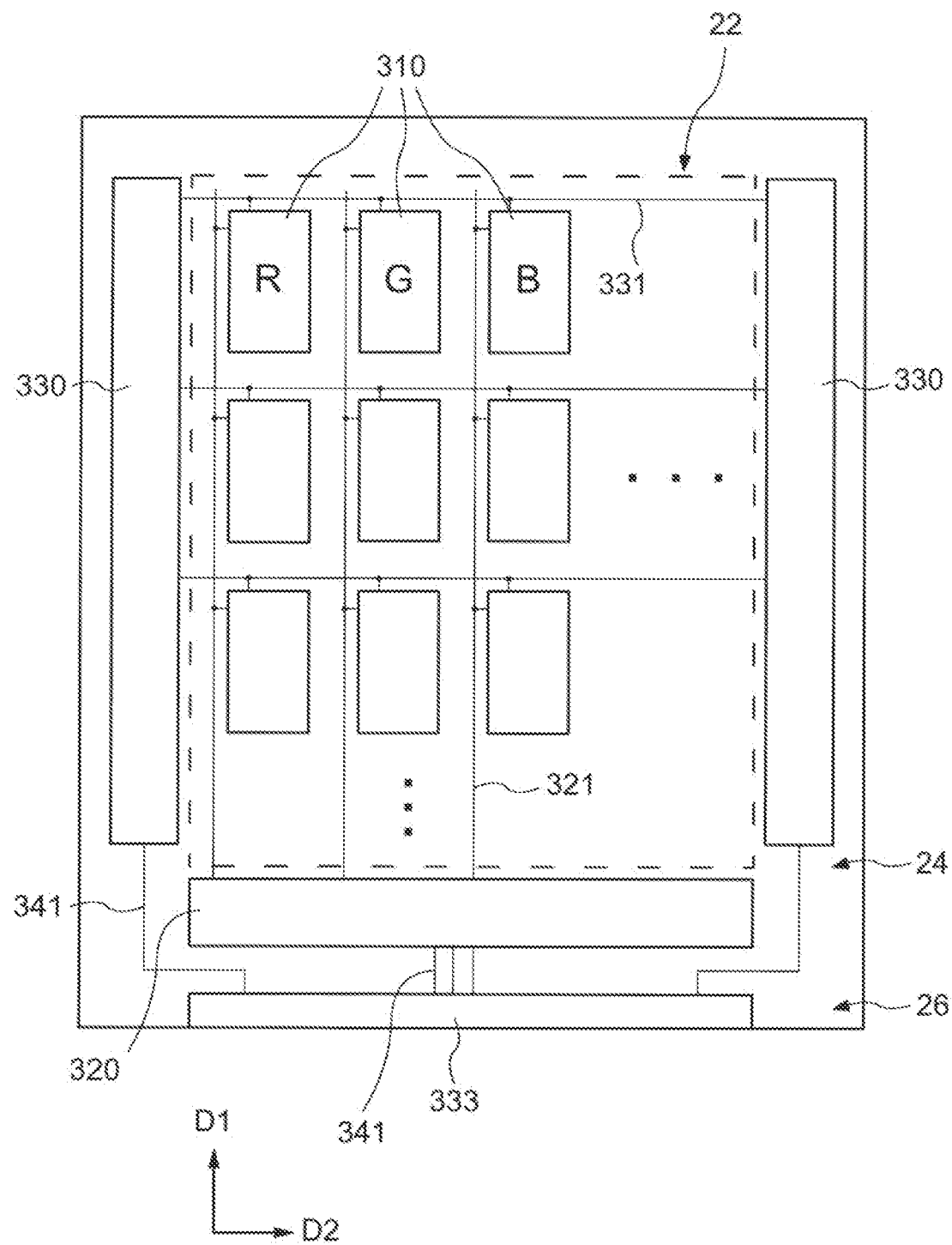
FIG. 2 is a block diagram showing a circuit configuration of a display device according to an embodiment of the present invention.

FIG. 2 is a block diagram showing a circuit configuration of a display device 10 according to an embodiment of the present invention. As shown in FIG. 2, a source driver circuit 320 and the liquid crystal area 22 where the pixel circuit 310 is arranged are adjacent in the direction D1, and the gate driver circuit 330B and the liquid crystal area 22 are adjacent in the direction D2. The source driver circuit 320 and the gate driver circuit 330 are provided in the seal area 24 described above. However, the area where the source driver circuit 320 and the gate driver circuit 330 are provided is not limited to the seal area 24, and it may be any area as long as it is outside the area provided with the pixel circuit 310.

A source wiring 321 extends in the direction D1 from the source driver circuit 320 and is connected to the multiple pixel circuits 310 arranged in the direction D1. A gate wiring 331 extends in the direction D2 from the gate driver circuit 330 and is connected to the multiple pixel circuits 310 arranged in the direction D2.

The terminal area 26 is provided with a terminal part 333. The terminal part 333 and the source driver circuit 320 are connected by a connecting wiring 341. Similarly, the terminal part 333 and the gate driver circuit 330 are connected by the connecting wiring 341. When the FPC 600 is connected to the terminal part 333, an external device to which the FPC 600 is connected and the display device 20 are connected, and each pixel circuit 310 provided in the display device 20 is driven by a signal from the external device.

[3. Pixel Circuit 310 of Display Device 10]

Figure 3:
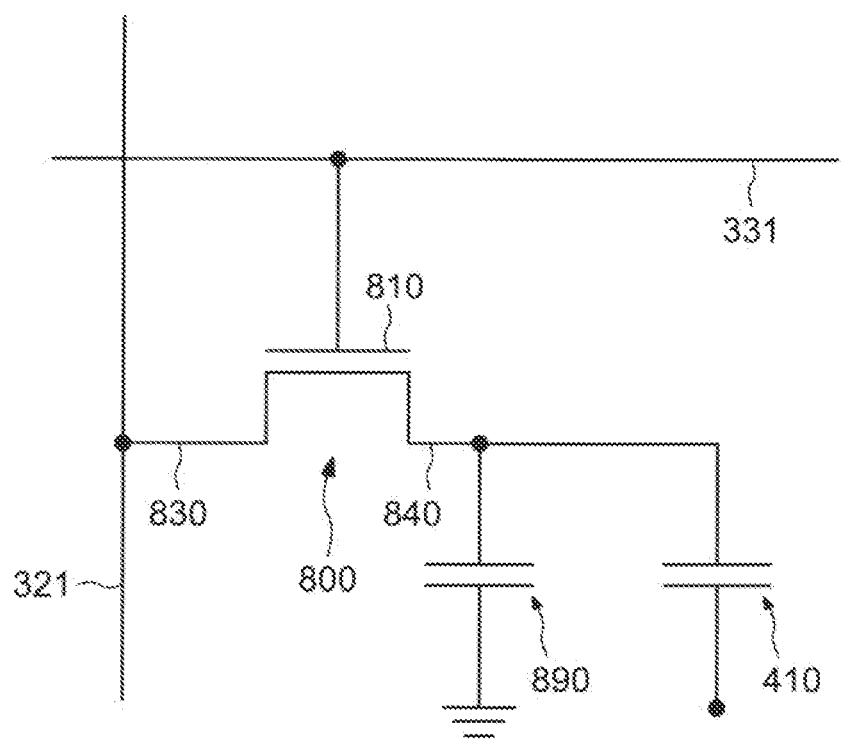
FIG. 3 is a circuit diagram showing a pixel circuit of a pixel of a display device according to an embodiment of the present invention.

FIG. 3 is a circuit diagram showing a pixel circuit of a display device 10 according to an embodiment of the present invention. As shown in FIG. 3, the pixel circuit 310 includes elements such as a transistor 800, a storage capacitor 890, and the liquid crystal element 410. One electrode of the storage capacitor 890 is the pixel electrode PTCO and the other electrode is the common electrode CTCO. Similarly, one electrode of the liquid crystal element 410 is the pixel electrode PTCO and the other electrode is the common electrode CTCO. The transistor 800 includes a first gate electrode 810B, a first source electrode 830, and a first drain electrode 840. The first gate electrode 810 is connected to the gate wiring 331. The first source electrode 830 is connected to the source wiring 321. The first drain electrode 840 is connected to the storage capacitor 890 and the liquid crystal element 410. In the present embodiment, for convenience of explanation, although 830B is referred to as a source electrode and 840B is referred to as a drain electrode, the function of each electrode as a source and a drain may be replaced.

[4. Configuration of Display Device 10]

Figure 4:
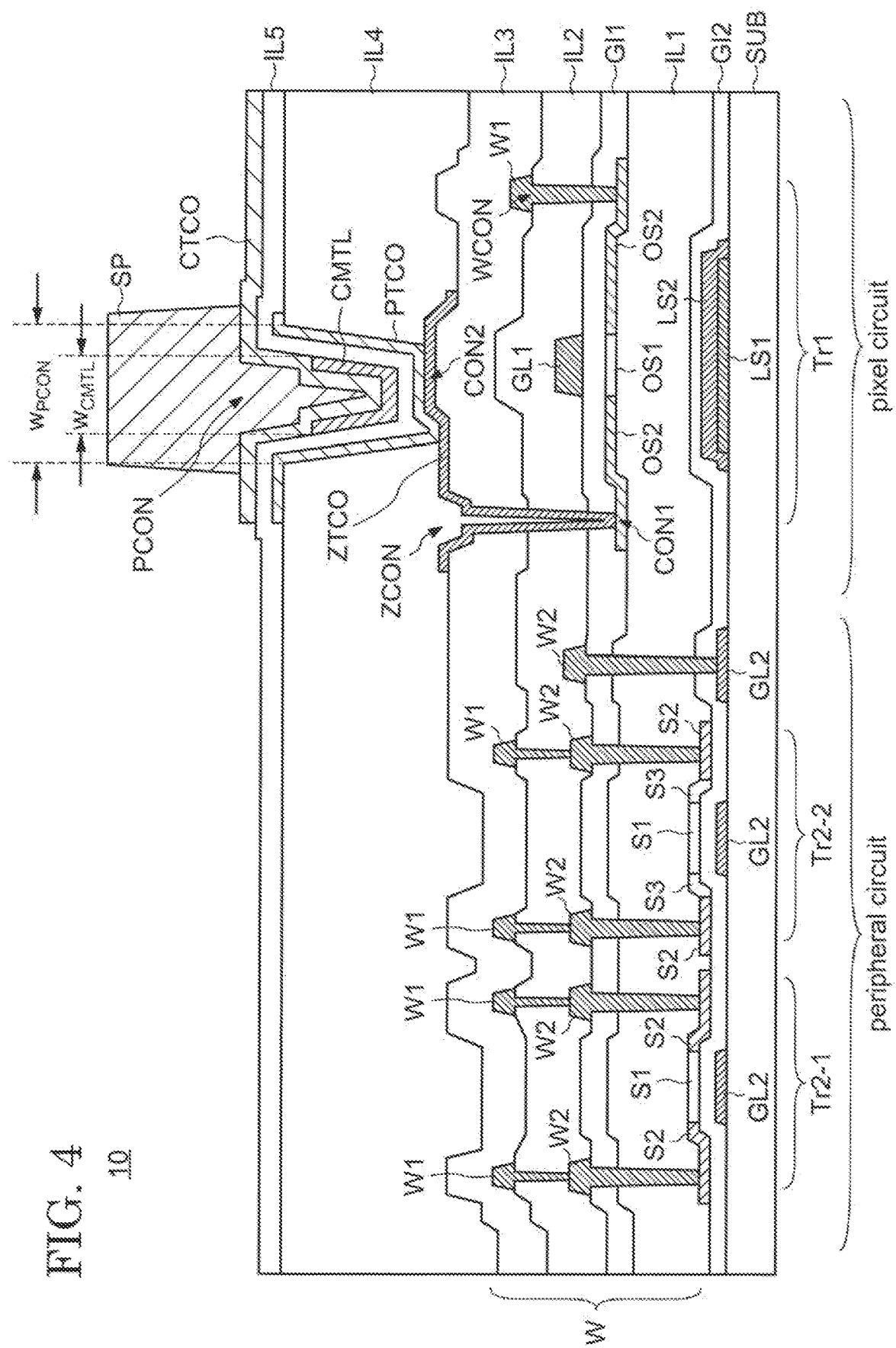
FIG. 4 is a cross-sectional view showing a configuration of a display device according to an embodiment of the present invention.
Figure 5:
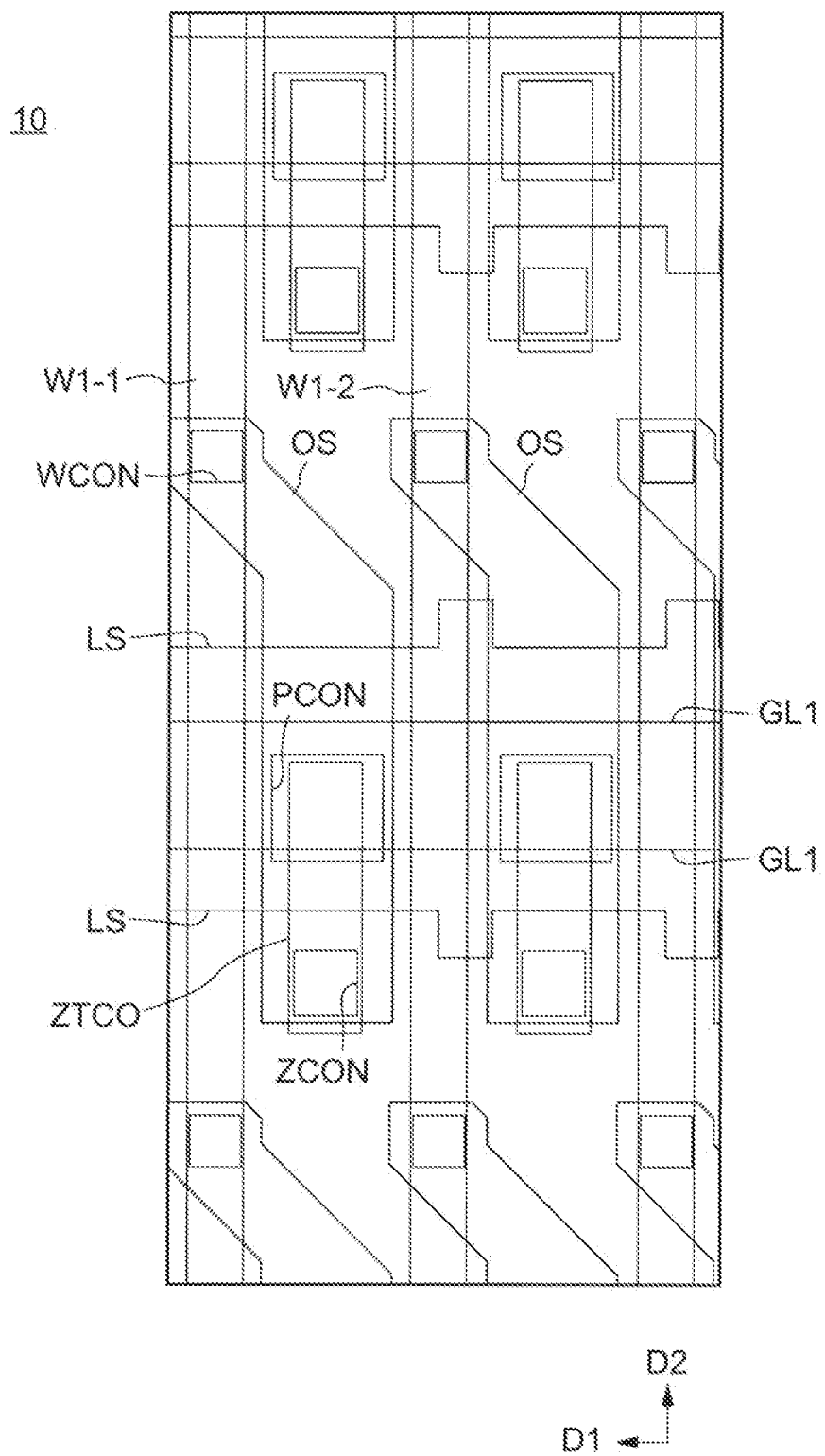
FIG. 5 is a plan view showing a configuration of a display device according to an embodiment of the present invention.
Figure 6:
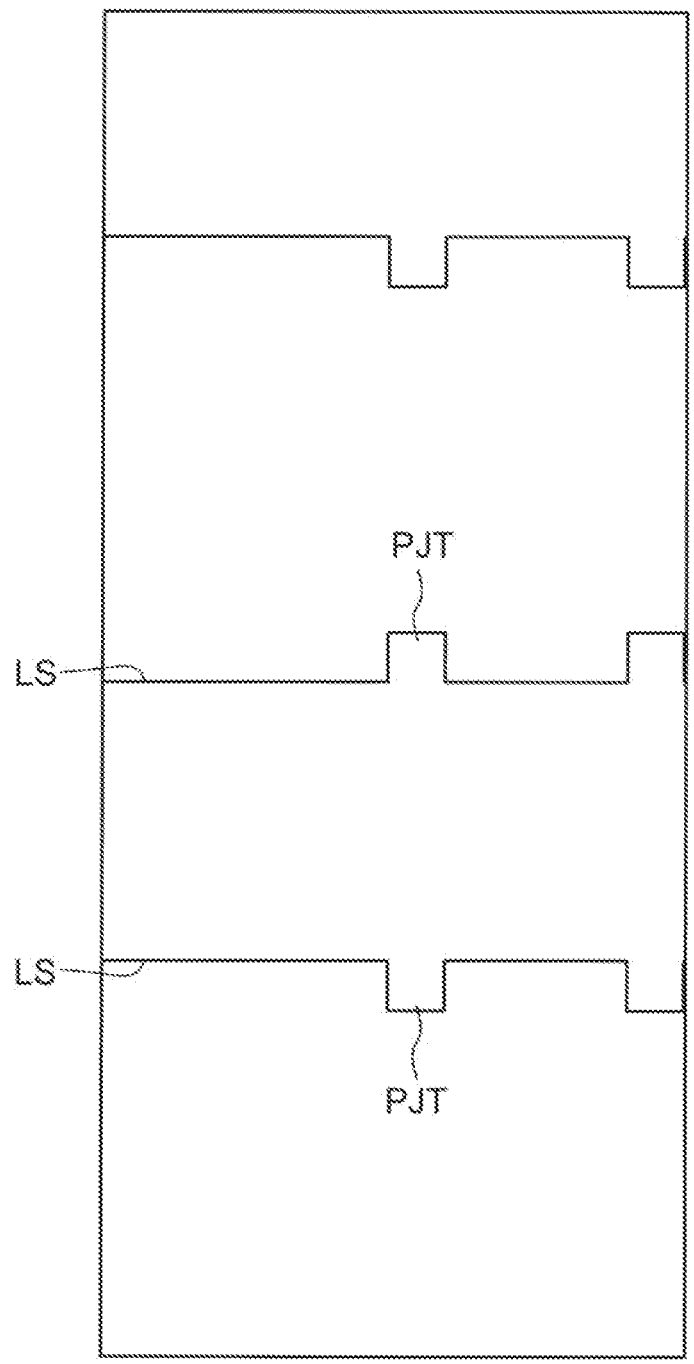
FIG. 6 is a plan view showing a layout of each layer in a display device according to an embodiment of the present invention.
Figure 6:

The details of a configuration of the display device 10 according to the embodiment of the present invention is described with reference to FIGS. 4 to 16. FIG. 4 is a cross-sectional view showing the configuration of the display device 10 according to the embodiment of the present invention. FIG. 5 is a plan view showing the configuration of the display device 10 according to the embodiment of the present invention. FIGS. 6 to 16 are plan views showing the layout of each layer in the display device 10 according to the embodiment of the present invention. The cross-sectional view of FIG. 4 is for explaining the layer structure of the display device 10, and the peripheral circuit and the pixel circuit are shown adjacent to each other. Needless to say, however, the pixel circuit is provided in the image display area and the peripheral circuits are provided in the frame area outside the image display area, and these circuits are provided apart from each other. Further, in particular, in the pixel circuit in FIG. 4, the peripheral portion of a contact hole in the pixel is mainly shown, and only a part of the translucent area (opening area) that contributes to the display is shown.

As shown in FIG. 4, the display device 10 includes a substrate SUB. The display device 10 also includes a transistor Tr1, a transistor Tr2, a wiring W, a connecting electrode ZTCO, a pixel electrode PTCO, a common auxiliary electrode CMTL, and a common electrode CTCO on the substrate SUB. TCO is an abbreviation for Transparent Conductive Oxide. The transistor Tr1 is a transistor included in the pixel circuit of the display device 10. The transistor Tr2 is a transistor included in a peripheral circuit such as the source driver circuit 320 or a the gate driver circuit 330.

[5. Configuration of Transistor Tr1]

The transistor Tr1 includes an oxide semiconductor layer OS, a gate insulating layer GI1, and a gate electrode GL1. The gate electrode GL1 faces the oxide semiconductor layer OS. The gate insulating layer GI1 is provided between the oxide semiconductor layer OS and the gate electrode GL1. In the present embodiment, although a top gate type transistor in which the oxide semiconductor layer OS is provided closer to the substrate SUB than the gate electrode GL1 is exemplified, a bottom gate type transistor in which a positional relationship between the gate electrode GL1 and the oxide semiconductor layer OS is reversed may be applied.

The oxide semiconductor layer OS includes oxide semiconductor layers OS1 and OS2. The oxide semiconductor layer OS1 is an oxide semiconductor layer in an area overlapping the gate electrode GL1 in a plan view. The oxide semiconductor layer OS1 functions as a semiconductor layer and is switched between a conductive state and a non-conductive state according to a voltage supplied to the gate electrode GL1. That is, the oxide semiconductor layer OS1 functions as a channel for the transistor Tr1. The oxide semiconductor layer OS2 functions as a conductive layer. The oxide semiconductor layers OS1 and OS2 are layers formed from the same oxide semiconductor layer. For example, the oxide semiconductor layer OS2 is a low resistance oxide semiconductor layer formed by doping impurities into a layer which has the same physical properties as the oxide semiconductor layer OS1.

An insulating layer IL2 is provided above the gate electrode GL1. A wiring W1 is provided above the insulating layer IL2. The wiring W1 is connected to the oxide semiconductor layer OS2 via an opening WCON provided in the insulating layer IL2 and the gate insulating layer GI1. A data signal related to pixel gradation is transmitted to the wiring W1. An insulating layer IL3 is provided above the insulating layer IL2 and the wiring W1. The connecting electrode ZTCO is provided above the insulating layer IL3. The connecting electrode ZTCO is connected to the oxide semiconductor layered OS2 via an opening ZCON provided in the insulating layers IL3, IL2, and the gate insulating layer GI1. The connecting electrode ZTCO is in contact with the oxide semiconductor layer OS2 at the bottom of the opening ZCON. The connecting electrode ZTCO is a transparent conductive layer.

An area where the connecting electrode ZTCO and the oxide semiconductor layers OS2 are in contact with each other is referred to as a first contact area CON1. The connecting electrode ZTCO may be referred to as a "first transparent conductive layer". As will be described in detail later, the first transparent conductive layer is in contact with the oxide semiconductor layer OS2 in the first contact area CON1 not overlapping the gate electrode GL1 and the wiring W1 in a plan view. The first contact area CON1 is included in the display area of a pixel in a plan view.

For example, when a transparent conductive layer such as an ITO layer is formed in contact with a semiconductor layer such as a silicon layer, a surface of the semiconductor layer is oxidized by a process gas or oxygen ions at the time of a deposition of an ITO film. Since an oxide layer formed on the surface of the semiconductor layer is high resistance, a contact resistance between the semiconductor layer and the transparent conductive layer is increased. Therefore, there is a defect in an electrical contact between the semiconductor layer and the transparent conductive layer. On the other hand, even if the above transparent conductive layer is formed so as to be in contact with the oxide semiconductor layer, a high resistance oxide layer as described above is not formed on a surface of the oxide semiconductor layer. Therefore, there is no defect in the electrical contact between the oxide semiconductor layer and the transparent conductive layer.

An insulating layer IL4 is provided above the connecting electrode ZTCO. The insulating layer IL4 eases (flattens) a step formed from a structure provided below the insulating layer IL4. The insulating layer IL4 may be referred to as a planarization film. The pixel electrode PTCO is provided above the insulating layer IL4. The pixel electrode PTCO is connected to the connecting electrode ZTCO via an opening PCON provided in the insulating layer IL4. An area where the connecting electrode ZTCO and the pixel electrode PTCO are in contact with each other is referred to as a second contact area CON2. The second contact area CON2 overlaps the gate electrode GL1 in a plan view. The pixel electrode PTCO is a transparent conductive layer.

An insulating layer IL5 is provided above the pixel electrode PTCO. The common auxiliary electrode CMTL and the common electrode CTCO are provided above the insulating layer IL5. Although the details are described later, the common auxialiary electrode CMTL and the common electrode CTCO respectively have different planar patterns. The common auxiliary electrode CMTL is a metal layer. The common electrode CTCO is a transparent conductive layer. The electric resistance of the common auxiliary electrode CMTL is lower than the electric resistance of the common electrode CTCO. The common auxiliary electrode CMTL also functions as a light-shielding layer. For example, the common auxiliary electrode CMTL shields light from adjacent pixels to suppress color mixing from occurring. A spacer SP is provided above the common electrode CTCO.

The spacer SP is provided for a part of the pixels. For example, the spacer SP may be provided for any one of a blue pixel, a red pixel and a green pixel. However, the spacer SP may be provided for all the pixels. A height of the spacer SP is half the height of a cell gap. A spacer is also provided on a counter substrate, and the spacer on the counter substrate and the above spacer SP overlap in a plan view. A configuration in which the height of the spacer SP is equal to the cell gap can also be applied. Further, as shown in FIG. 4, although the spacer SP is filled in the opening PCON and protrudes toward the counter substrate side, a configuration in which the contact hole is only filled with the filler can be applied.

A light-shielding layer LS is provided between the transistor Tr1 and the substrate SUB. In the present embodiment, light-shielding layers LS1, LS2 are provided as the light-shielding layer LS. However, the light-shielding layer LS may be formed of only the light-shielding layer LS1 or LS2. In a plan view, the light-shielding layer LS is provided in an area where the gate electrode GL1 and the oxide semiconductor layer OS overlap. That is, in a plan view, the light-shielding layer LS is provided in an area overlapping the oxide semiconductor layer OS1. The light-shielding layer LS suppresses the light incident from the substrate SUB side from reaching the oxide semiconductor layer OS1. In the case where a conductive layer is used as the light-shielding layer LS, a voltage may be applied to the light-shielding layer LS to control the oxide semiconductor layer OS1. In the case where a voltage is applied to the light-shielding layer LS, the light-shielding layer LS and the gate electrode GL1 may be connected by a peripheral area of the pixel circuit. In a plan view, the above first contact area CON1 is provided in an area not overlapping the light-shielding layer LS.

[6. Configuration of Transistor Tr2]

The transistor Tr2 has a p-type transistor Tr2-1 and an n-type transistor Tr2-2.

The p-type transistor Tr2-1 and the n-type transistor Tr2-2 both include a gate electrode GL2, a gate insulating layer GI2, and a semiconductor layer S (S1 and S2, or S1, S2 and S3). The gate electrode GL2 faces the semiconductor layer S. The gate insulating layer GI2 is provided between the semiconductor layer S and the gate electrode GL2. In the present embodiment, although a bottom gate type transistor in which the gate electrode GL2 is provided closer to the substrate SUB than the semiconductor layer S is exemplified, a top gate type transistor in which a positional relationship between the semiconductor layer S and the gate electrode GL2 is reversed may be used as the display device.

The semiconductor layer S of the p-type transistor Tr2-1 includes semiconductor layers S1 and S2. The semiconductor layer S of the n-type transistor Tr2-2 includes the semiconductor layers S1, S2 and S3. The semiconductor layer S1 is a semiconductor layer overlapping the gate electrode GL2 in a plan view. The semiconductor layer S1 functions as a channel for the transistors Tr2-1 and Tr2-2. The semiconductor layer S2 functions as a conductive layer. The semiconductor layer S3 functions as a conductive layer with a higher resistance than the semiconductor layer S2. The semiconductor layer S3 suppresses hot carrier degradation by attenuating hot carriers intruding toward the semiconductor layer S1.

An insulating layer IL1 and the gate insulating layer GI1 are provided on the semiconductor layer S. In the transistor Tr2, the gate insulating layer GI1 simply functions as an interlayer film. A wiring W2 is provided above these insulating layers. The wiring W2 is connected to the semiconductor layer S via an opening provided in the insulating layer IL1 and the gate insulating layer GI1. The insulating layer IL2 is provided on the wiring W2. The wiring W1 is provided on the insulating layer IL2. The wiring W1 is connected to the wiring W2 via an opening provided in the insulating layer IL2.

The gate electrode GL2 and the light-shielding layer LS2 are the same layer. The wiring W2 and the gate electrode GL1 are the same layer. The same layer means that multiple members are formed from one patterned layer.

[7. Plane Layout of Display Device 10]

Figure 15:
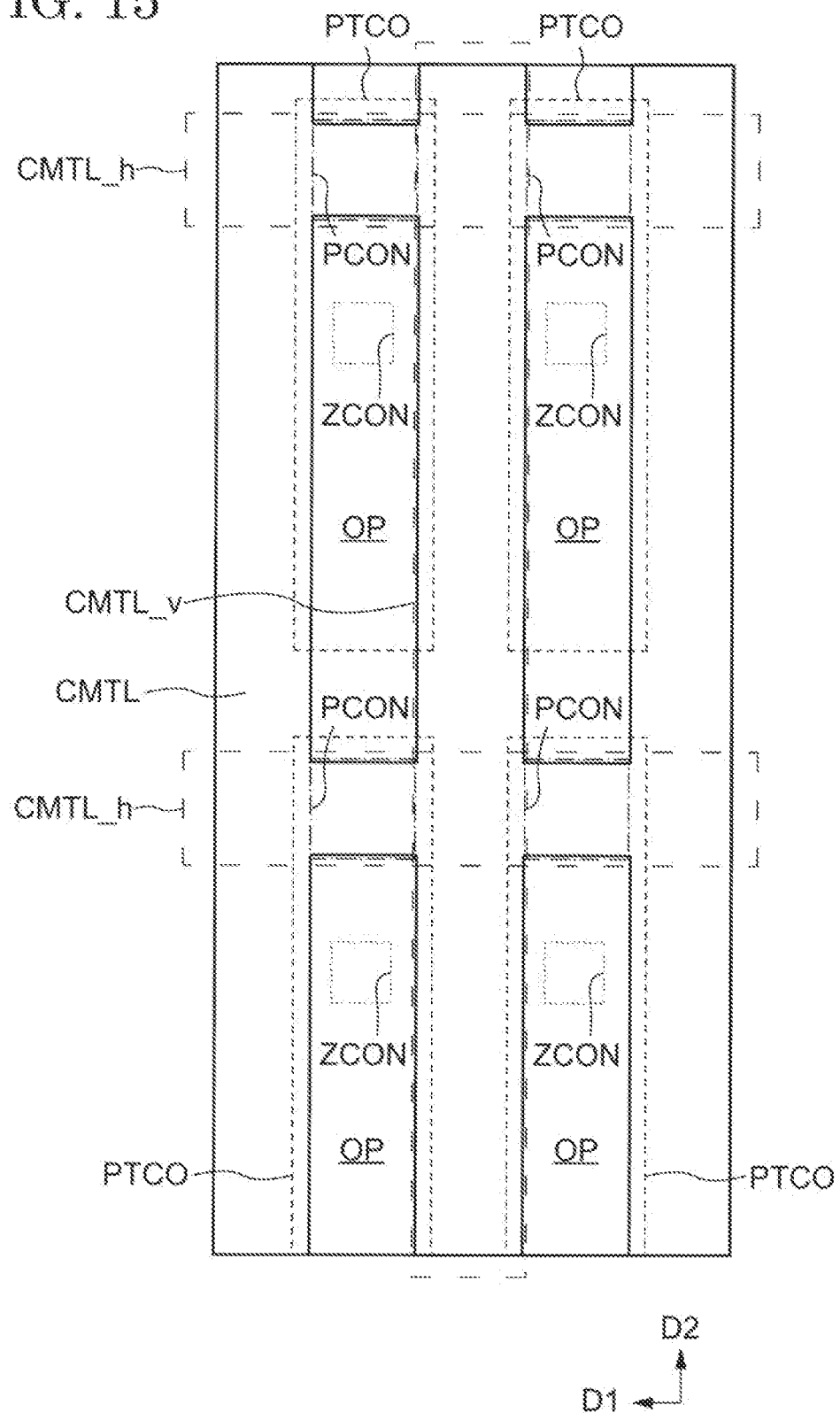
FIG. 15 is a plan view showing a layout of each layer in a display device according to an embodiment of the present invention.
Figure 16:
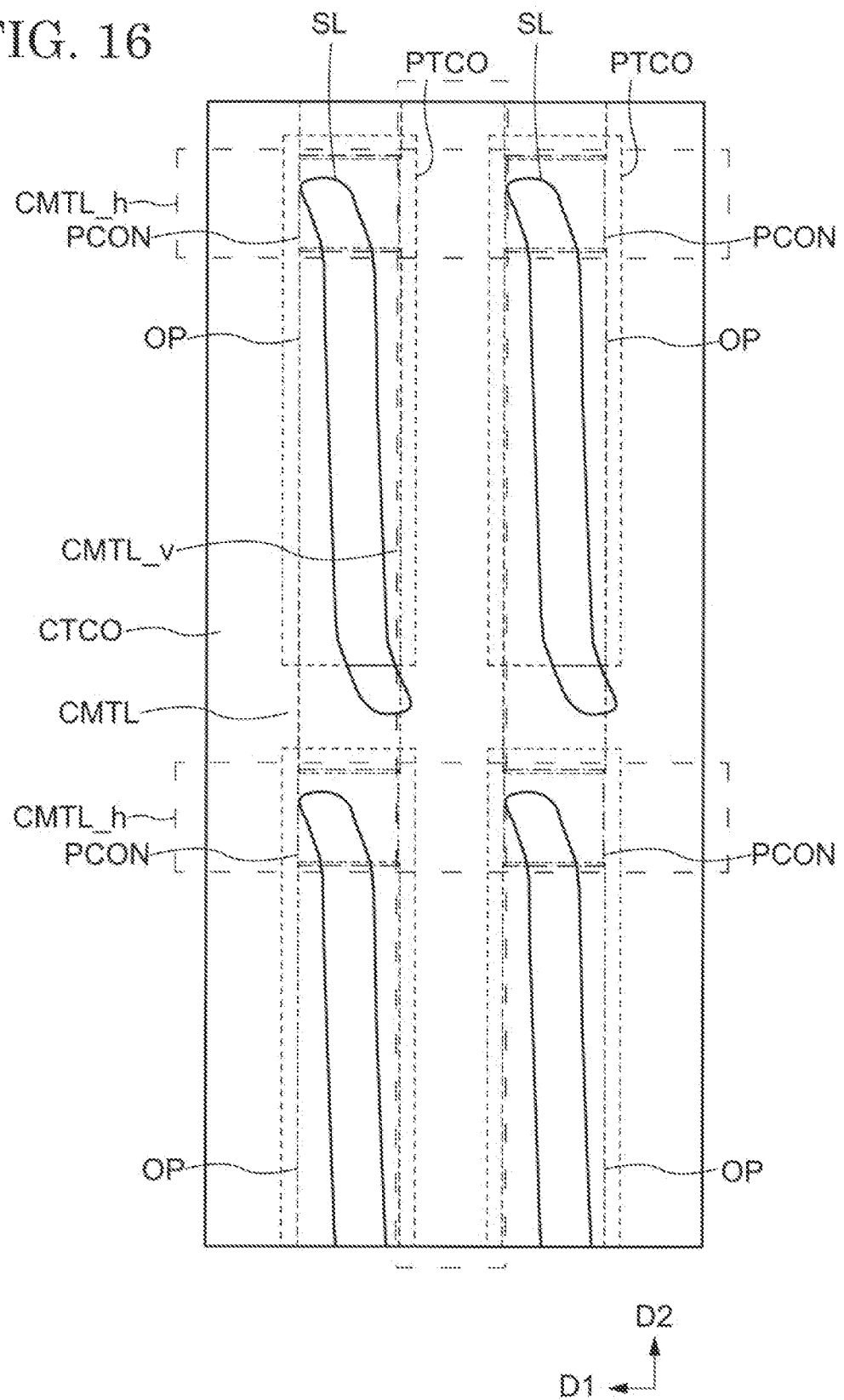
FIG. 16 is a plan view showing a layout of each layer in a display device according to an embodiment of the present invention.

A plane layout of a pixel of the display device 10 is described with reference to FIGS. 5 to 16. In FIG. 5, the pixel electrode PTCO, the common auxiliary electrode CMTL, the common electrode CTCO, and the spacer SP are omitted. The plane layout of the pixel electrode PTCO, the common auxiliary electrode CMTL, and the common electrode CTCO are shown in FIGS. 14 to 16, respectively.

Figure 8:
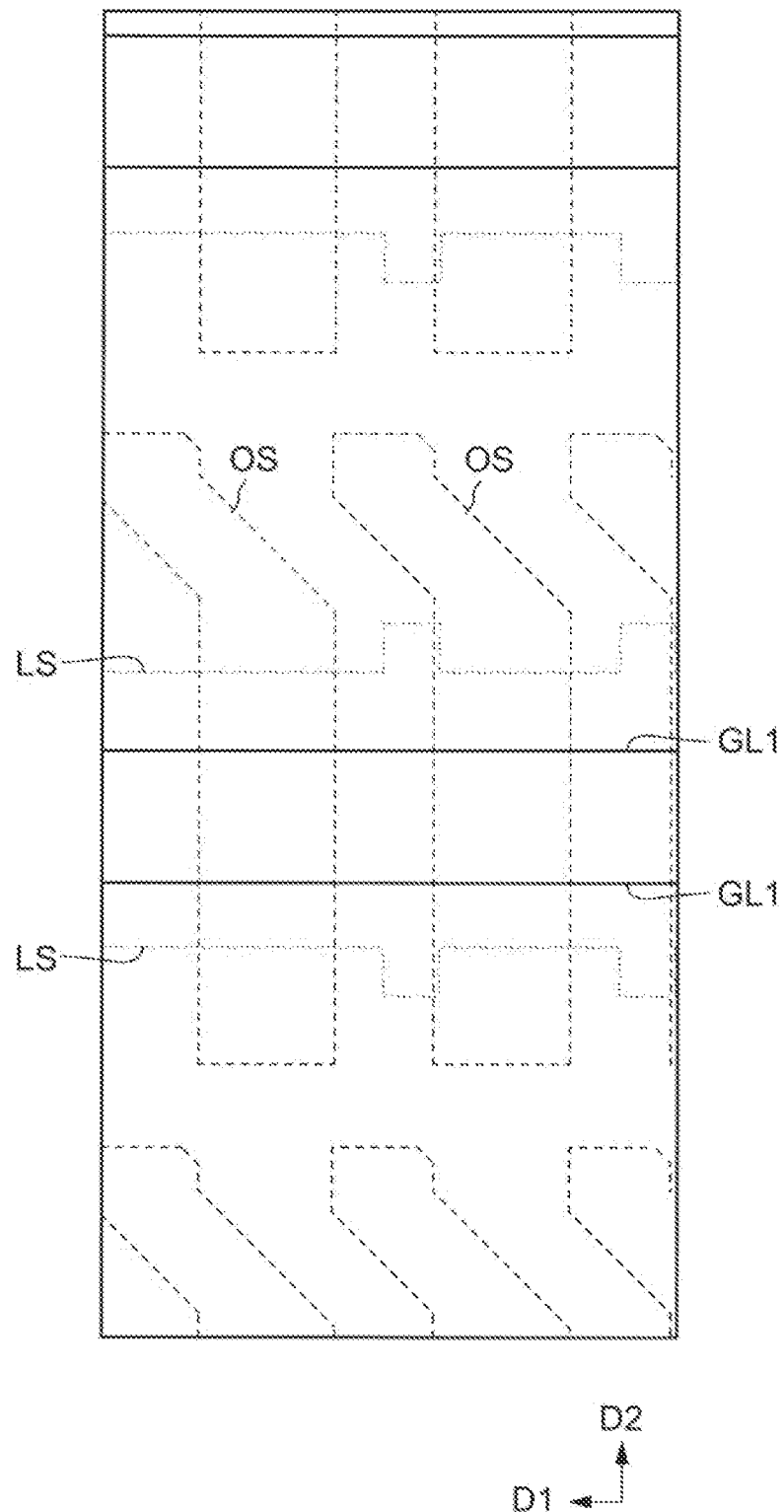
FIG. 8 is a plan view showing a layout of each layer in a display device according to an embodiment of the present invention.

As shown in FIGS. 4 and 5, the light shielding layer LS extends in the first direction D1 and is commonly provided in the pixels arranged in the first direction D1. A shape of the light shielding layer LS may be different depending on the pixel. In the present embodiment, a protruding part PJT is provided so as to protrude from a part of the light shielding layer LS extending in the first direction D1 to the second direction D2 intersecting the first direction D1. As shown in FIG. 8, the light shielding layer LS is provided in an area including the area where the gate electrode GL1 and the oxide semiconductor layer OS overlap in a plan view. The gate electrode GL1 can also be referred to as a "gate wire".

Figure 7:
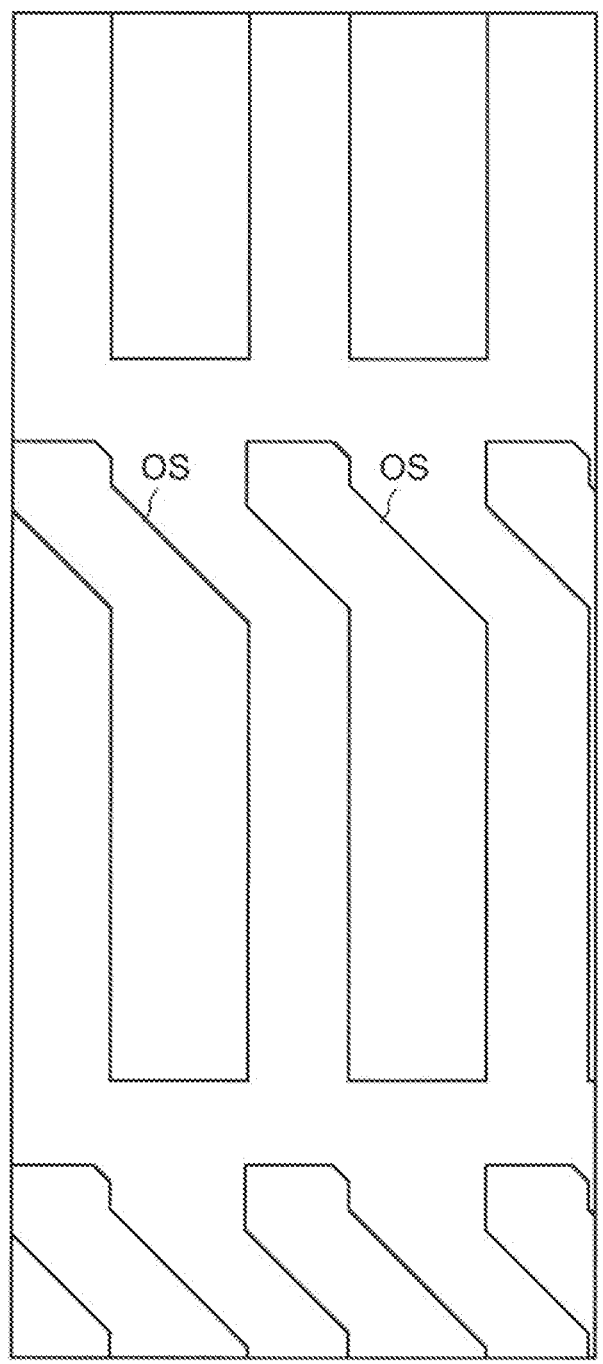
FIG. 7 is a plan view showing a layout of each layer in a display device according to an embodiment of the present invention.

As shown in FIGS. 4, 7, and 8, the oxide semiconductor layer OS extends in the direction D2. The gate electrode GL1 extends in the direction D1 so as to intersect the oxide semiconductor layer OS. A pattern of the gate electrode GL1 is provided inside a pattern of the light shielding layer LS.

Figure 9:
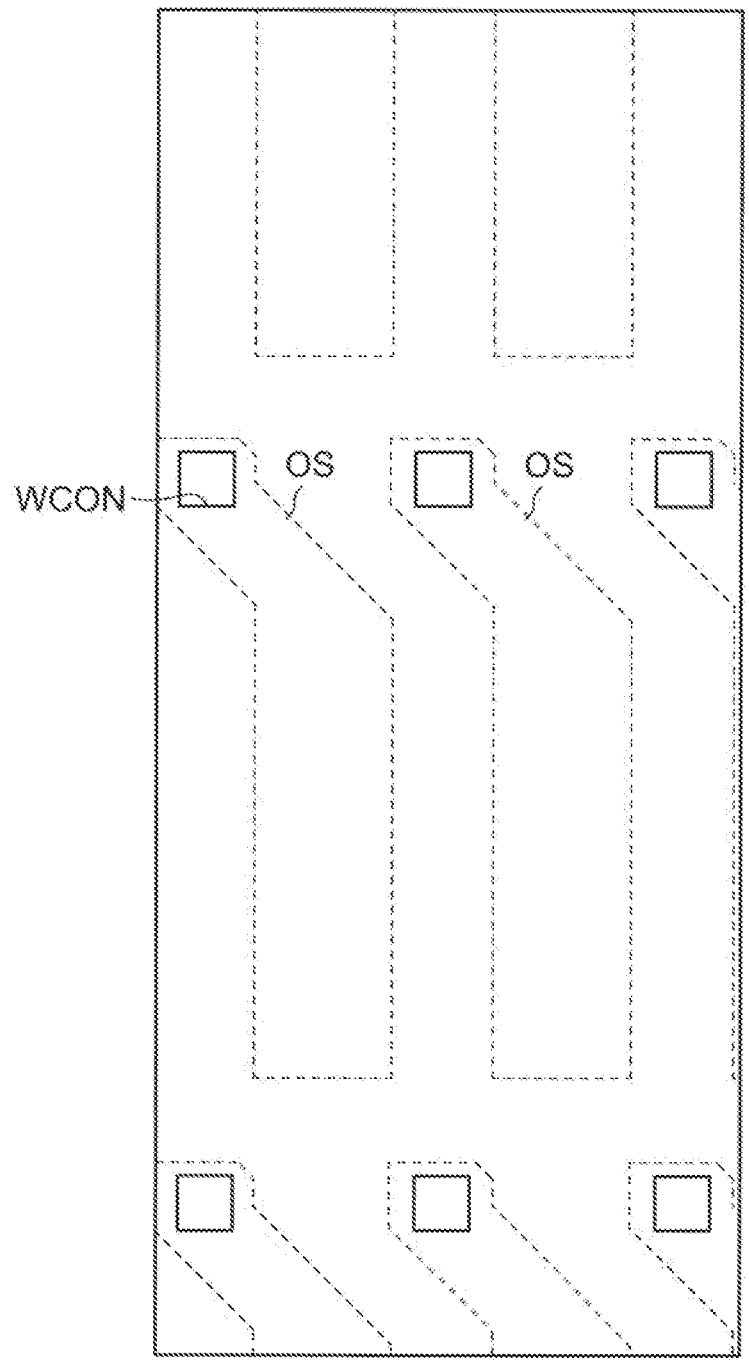
FIG. 9 is a plan view showing a layout of each layer in a display device according to an embodiment of the present invention.
Figure 10:
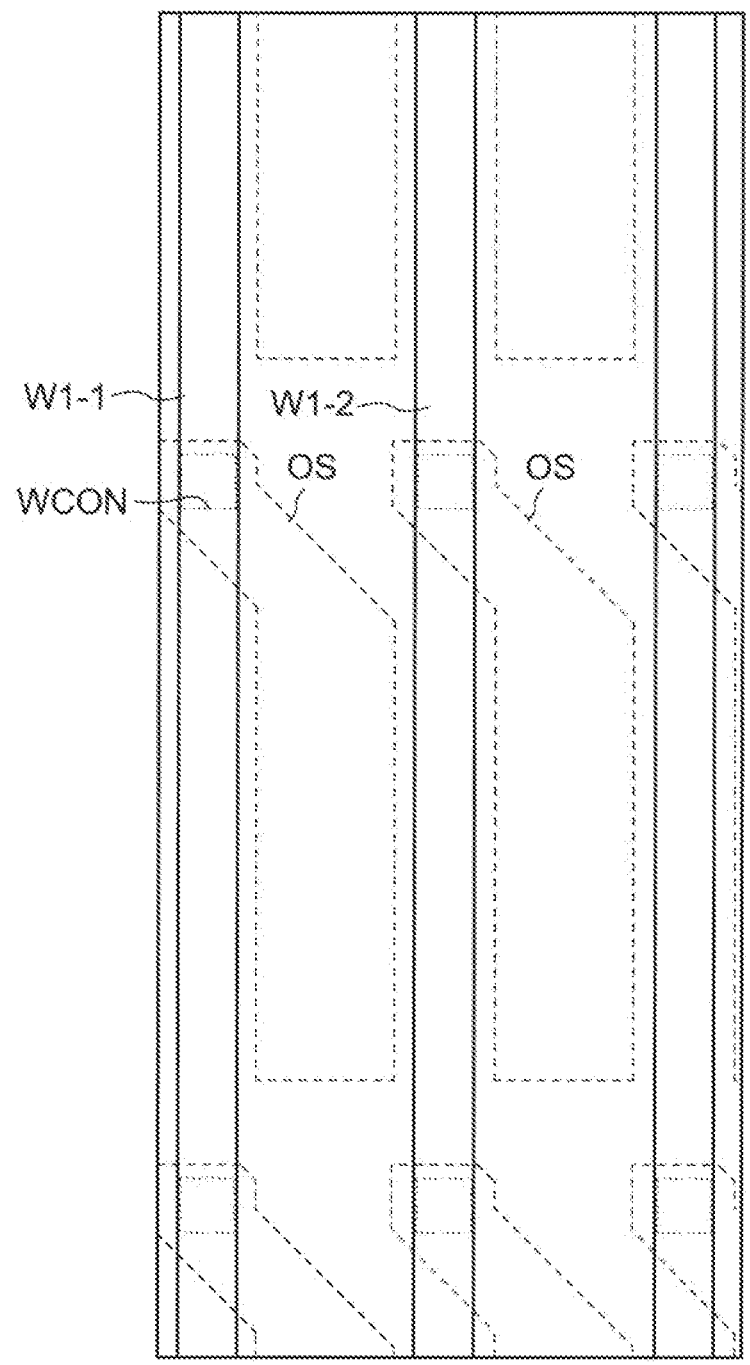
FIG. 10 is a plan view showing a layout of each layer in a display device according to an embodiment of the present invention.
Figure 10:

As shown in FIGS. 4, 9, and 10, the opening WCON is provided in an area overlapping the wiring W1 near an upper end of the pattern of the oxide semiconductor layer OS. A main part of the pattern of the oxide semiconductor layer OS extends in the direction D2 between a pair of the adjacent wirings W1. The remaining part of the pattern of the oxide semiconductor layer OS extends obliquely in the direction D1 and the direction D2 from the main part and overlaps the opening WCON.

As shown in FIGS. 4 and 10, multiple wirings W1 extend in the direction D2. In the case where the adjacent wirings W1 need to be described separately, the adjacent wiring W1 is referred to as a first wiring W1-1 and a second wiring W1-2. In this case, it can be said that the main part of the oxide semiconductor layer OS extends in the direction D2 between the first wiring W1-1 and the second wiring W1-2, and intersects the gate electrode GL1.

Figure 11:
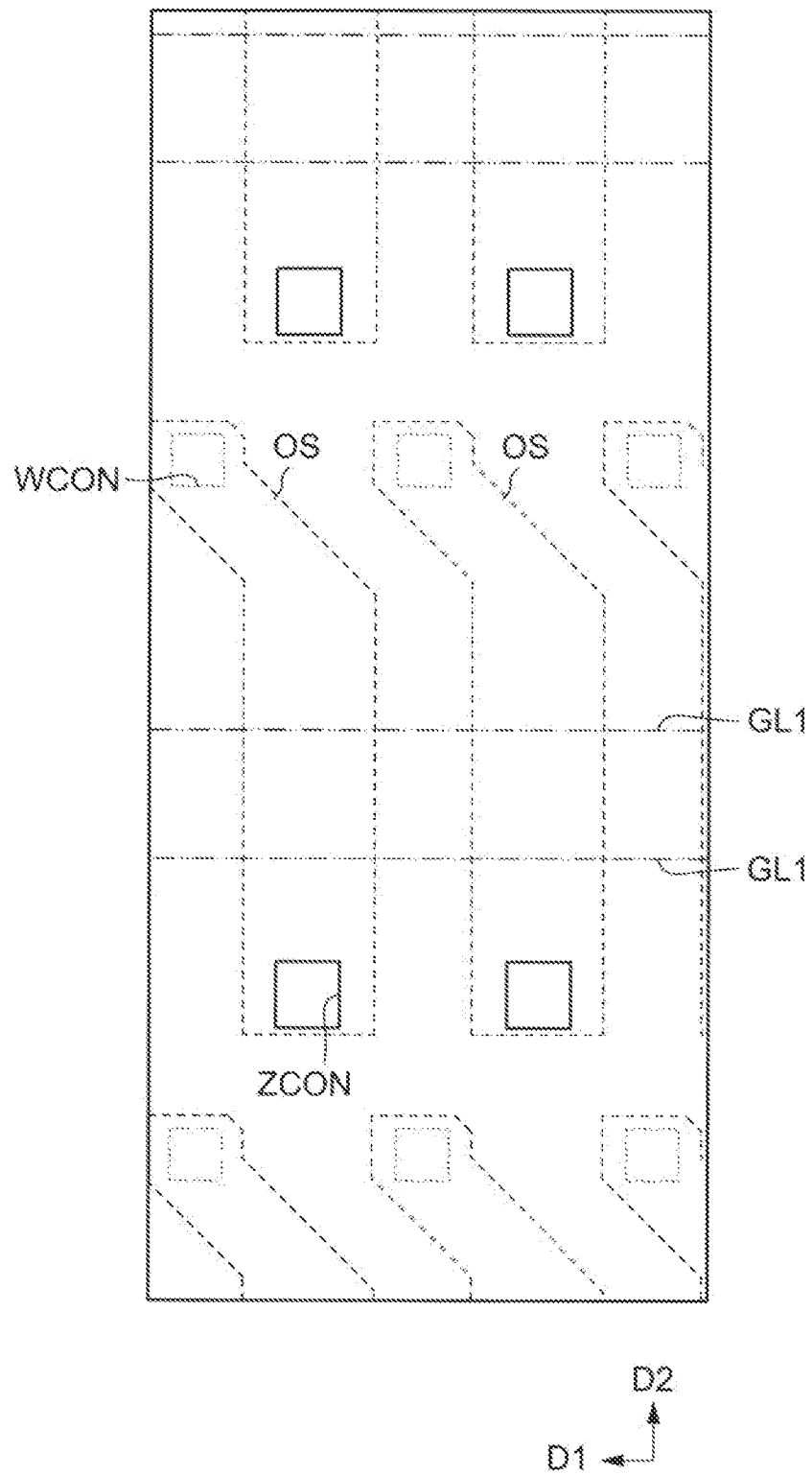
FIG. 11 is a plan view showing a layout of each layer in a display device according to an embodiment of the present invention.
Figure 12:
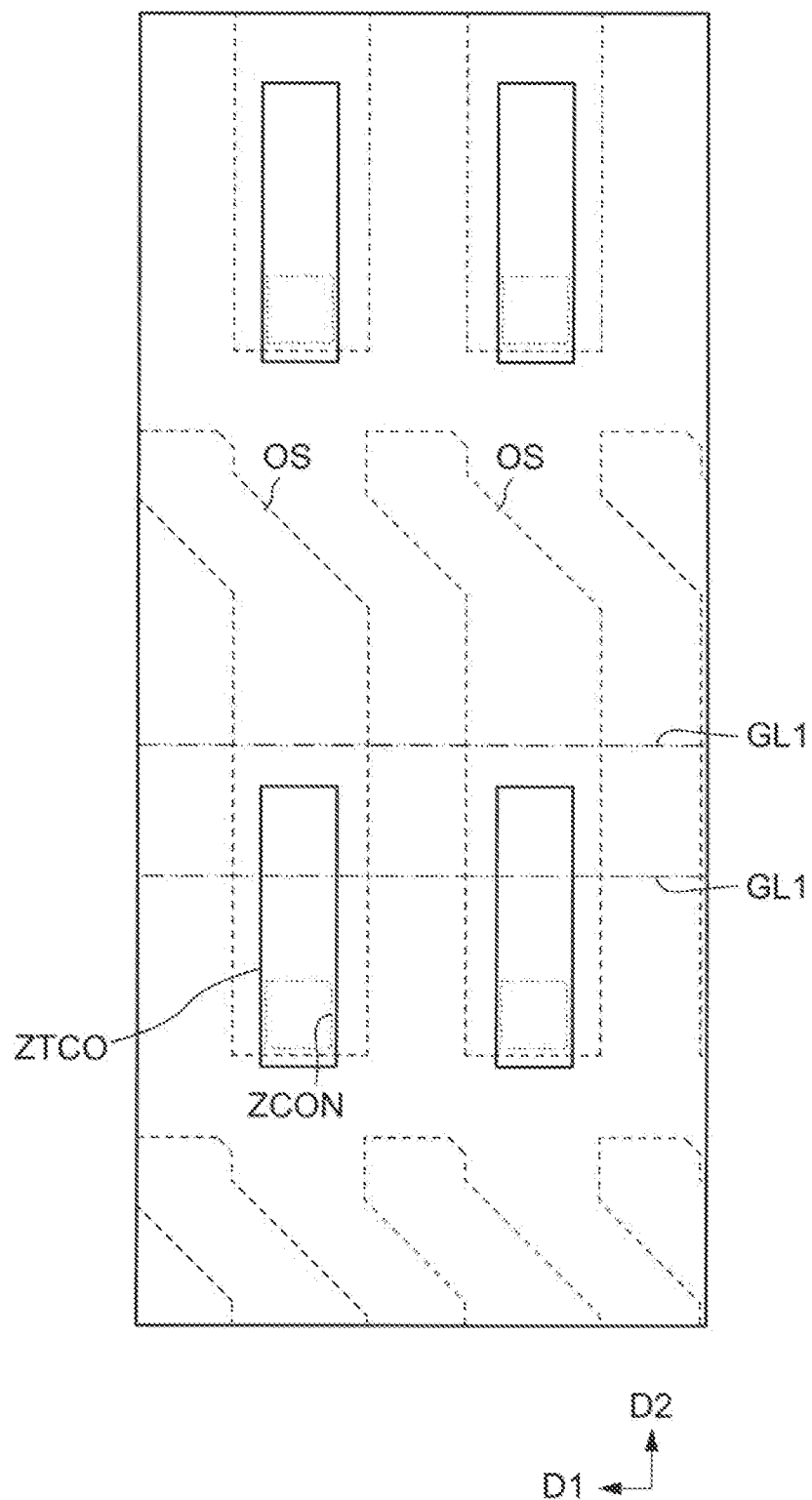
FIG. 12 is a plan view showing a layout of each layer in a display device according to an embodiment of the present invention.

As shown in FIGS. 4, 11, and 12, the opening ZCON is provided near a lower end of the pattern of the oxide semiconductor layer OS. The opening ZCON is provided in an area overlapping the pattern of the oxide semiconductor layer OS and not overlapping the gate electrode GL1. The opening ZCON is provided in an area overlapping the connecting electrode ZTCO. The connecting electrode ZTCO overlaps the gate electrode GL1 and the oxide semiconductor layer OS between the first wiring W1-1 and the second wiring W1-2. Therefore, the connecting electrode ZTCO is in contact with the oxide semiconductor layer OS in the opening ZCON (the first contact area CON1) not overlapping the gate electrode GL1.

As shown in FIGS. 4, 10, and 11, the oxide semiconductor layer OS is in contact with the wiring W1 at the opposite side of the opening ZCON (the first contact area CON1) with respect to the gate electrode GL1. The opening ZCON (the first contact area CON1) does not overlap the light shielding layer LS.

Figure 13:
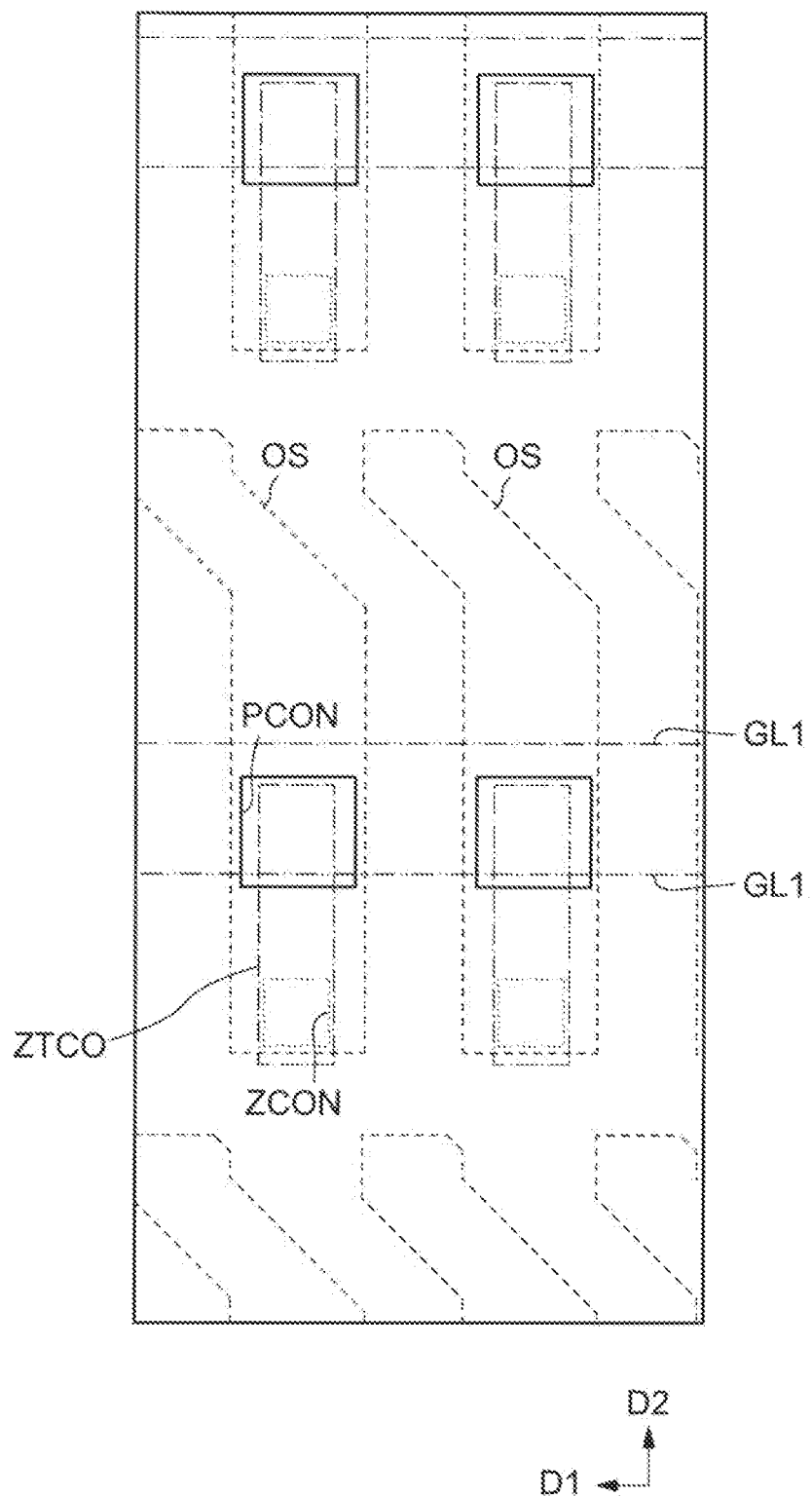
FIG. 13 is a plan view showing a layout of each layer in a display device according to an embodiment of the present invention.
Figure 14:
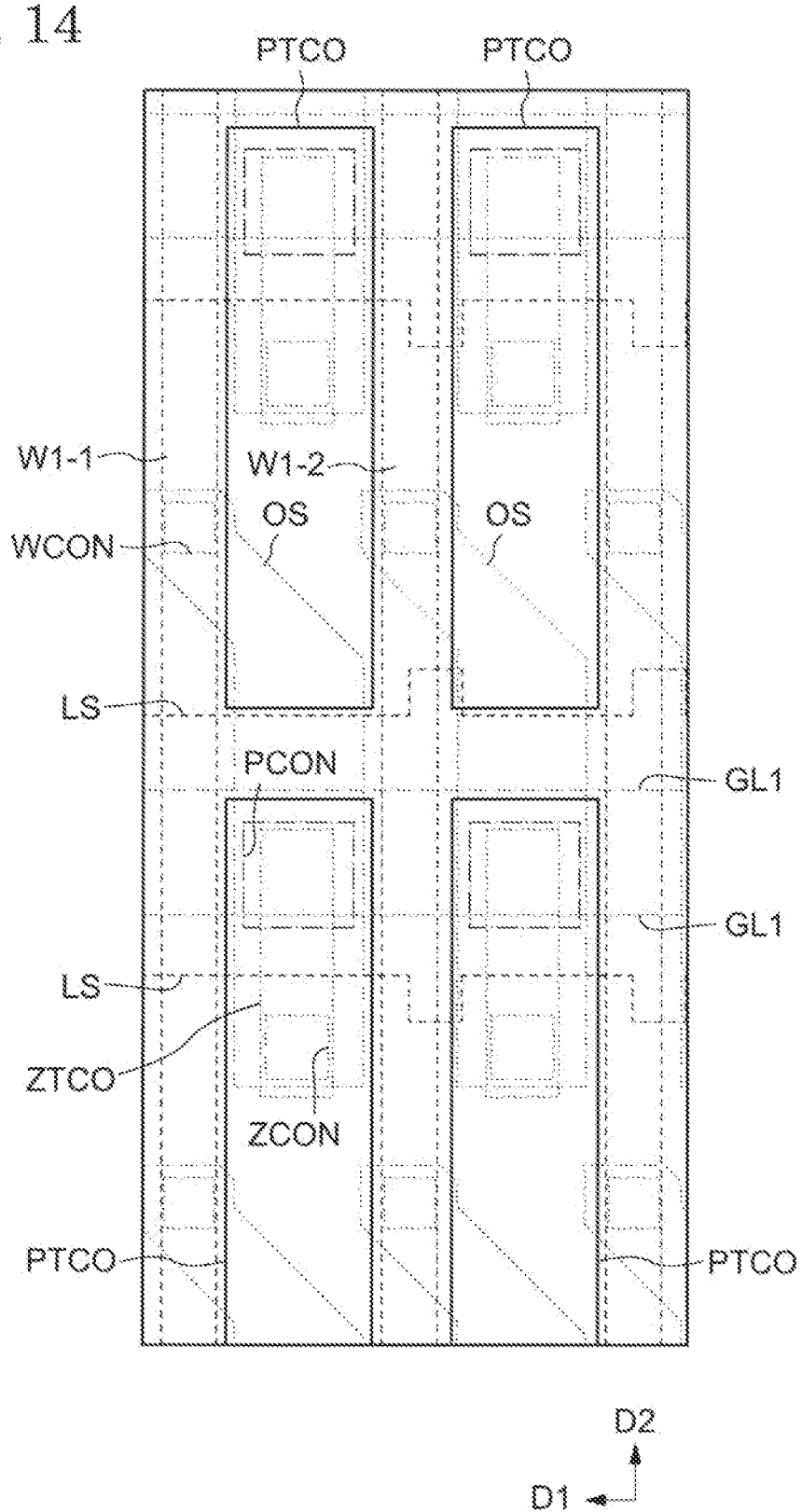
FIG. 14 is a plan view showing a layout of each layer in a display device according to an embodiment of the present invention.

As shown in FIGS. 4, 13, and 14, the opening PCON is provided near an upper end of a pattern of the connecting electrode ZTCO. The opening PCON is provided in an area overlapping the pattern of the gate electrode GL1 and the pattern of the connecting electrode ZTCO. The opening PCON is provided in an area overlapping the pixel electrode PTCO. The pixel electrode PTCO overlaps the gate electrode GL1, the oxide semiconductor layer OS, and the connecting electrode ZTCO between the first wiring W1-1 and the second wiring W1-2. Therefore, the pixel electrode PTCO is in contact with the connecting electrode ZTCO in the opening PCON (the second contact area CON2) overlapping the gate electrode GL1.

As shown in FIG. 15, the common auxiliary electrode CMTL overlaps a part of each pixel electrode PTCO of a plurality of pixels and is provided in a grid pattern, and an opening OP is formed at a position facing each pixel electrode PTCO. Specifically, the common auxiliary electrode CMTL is provided in common to the plurality of pixels without being divided at least in the image display area, and overlaps the opening PCON in each pixel and also overlaps a part of an edge of each pixel electrode PTCO. Therefore, the common auxiliary electrode CMTL overlaps the pixel electrode PTCO in the opening PCON. Further, the common auxiliary electrode CMTL also overlaps the gate electrode GL1 in a plan view. On the other hand, the common auxiliary electrode CMTL is opened so that the pixel electrode PTCO including the opening ZCON is exposed. That is, the opening ZCON (the first contact area CON1) is included in the display area. Here, the display area means an area in which the user can visually recognize the light from the pixels when viewed in pixel units. For example, an area that is shielded by a metal layer and in which the user cannot see the light is not included in the display area. That is, the above display area may be referred to as a "translucent area (or opening area)".

As shown in FIG. 16, the common electrode CTCO is commonly provided in the plurality of pixels without being divided at least in the image display area. The common electrode CTCO overlaps the pixel electrode PTCO. The common electrode CTCO is provided with a slit SL in the area corresponding to each opening OP. The slit SL has a curved shape (a vertically long S-shape). The tip of the slit SL has a shape in which the width orthogonal to the extending direction of the tip becomes small. Further, one tip of the slit SL overlaps the common auxiliary electrode CMTL in the opening PCON and overlaps the pixel electrode PTCO. Furthermore, although the other tip of the slit SL is located in the opening OP, it does not overlap with the pixel electrode PTCO.

[8. Materials of Each Member of Display Device 10]

A rigid substrate having light transmittance and no flexibility, such as a glass substrate, a silica substrate, and a sapphire substrate can be used as the substrate SUB. On the other hand, in the case where the substrate SUB needs to have flexibility, a flexible substrate containing a resin and having flexibility, such as a polyimide substrate, an acrylic substrate, a siloxane substrate, or a fluororesin substrate can be used as the substrate SUB. In order to improve the heat resistance of the substrate SUB, impurities may be introduced into the above resin.

General metal materials can be used as the gate electrodes GL1, GL2, the wirings W1, W2, the light-shielding layer LS, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), and silver (Ag), or alloys or compounds thereof are used as members of these electrodes and the like. The above materials may be used in a single layer or a stacked layer as the members of the above electrodes and the like.

For example, a stacked structure of Ti/Al/Ti is used as the gate electrode GL1. In the present embodiment, the cross-sectional shape of a pattern end of the gate electrode GL1 having the above stacked structure is a forward taper shape.

General insulating materials can be used as the gate insulating layers GI1, GI2, and the insulating layers IL1 to IL5. For example, inorganic insulating layers such as silicon oxide (SiO$_x$), silicon oxynitride (SiO$_x$N$_y$), silicon nitride (SiN$_x$), silicon nitride oxide (SiN$_x$O$_y$), aluminum oxide (AlO$_x$), aluminum oxynitride (AlO$_x$N$_y$), aluminum nitride oxide (AlN$_x$O$_y$), aluminum nitride (AlN$_x$), and the like can be used as the insulating layers IL1 to IL3, and IL5. Low-defect insulating layers can be used as these insulating layers. Organic insulating materials such as a polyimide resin, an acrylic resin, an epoxy resin, a silicone resin, a fluororesin, or a siloxane resin can be used as the insulating layer IL4. The above organic insulating materials may be used as the gate insulating layers GI1, GI2, and the insulating layers IL1 to IL3, IL5. The above materials may be used in a single layer or a stacked layer as a member of the insulating layer and the like.

SiO$_x$ with a thickness of 100 nm is used as the gate insulating layer GI1 as an example of the above insulating layer. SiO$_x$/SiN$_x$/SiO$_x$ with a total thickness of 600 nm to 700 nm is used as the insulating layer IL1. SiO$_x$/SiN$_x$ with a total thickness of 60 nm to 100 nm is used as the gate insulating layer GI2. SiO$_x$/SiN$_x$/SiO$_x$ with a total thickness of 300 nm to 500 nm is used as the insulating layer IL2. SiO$_x$ with a total thickness of 200 nm to 500 nm (single layer), SiN$_x$ (single layer), or a stacked layer thereof is used as the insulating layer IL3. The organic layer with a thickness of 2 μm to 4 μm is used as the insulating layer IL4. SiN$_x$ (single layer) with a thickness of 50 nm to 150 nm is used as the insulating layer IL5.

The above SiO$_x$N$_y$ and AlO$_x$N$_y$ are silicone compounds and aluminum compounds containing nitrogen (N) in a smaller ratio (x>y) than oxygen (O). The above SiN$_x$O$_y$ and AlN$_x$O$_y$ are silicon compounds and aluminum compounds containing oxygen in a smaller ratio (x>y) than nitrogen.

A oxide semiconductor having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used as the oxide semiconductor layer OS. In particular, an oxide semiconductor having a composition ratio of In:Ga:Zn:O=1:1:1:4 can be used. However, the oxide semiconductor containing In, Ga, Zn, and O used in the present embodiment is not limited to the above composition, and an oxide semiconductor having a composition different from that described above can also be used. For example, the ratio of In may be larger than that described above to improve mobility. The ratio of Ga may be larger to increase the band gap and reduce the influence of light irradiation.

Other elements may be added to the oxide semiconductor containing In, Ga, Zn, and O. For example, a metal element such as Al or Sn may be added to the oxide semiconductor. In addition to the oxide semiconductor described above, an oxide semiconductor containing In and Ga (IGO), an oxide semiconductor containing In and Zn (IZO), an oxide semiconductor containing In, Sn, and Zn (ITZO), and an oxide semiconductor containing In and W may be used as the oxide semiconductor layer OS. The oxide semiconductor layer OS may be amorphous or crystalline. The oxide semiconductor layer OS may be a mixed phase of amorphous and crystalline.

A transparent conductive layer is used as the connecting electrode ZTCO, the pixel electrode PTCO, and the common electrode CTCO. A mixture of indium oxide and tin oxide (ITO) and a mixture of indium oxide and zinc oxide (IZO) can be used as the transparent conductive layer. Materials other than the above may be used as the transparent conductive layer.

[9. Width of Each Layer in Second Direction D2]

Figure 17:
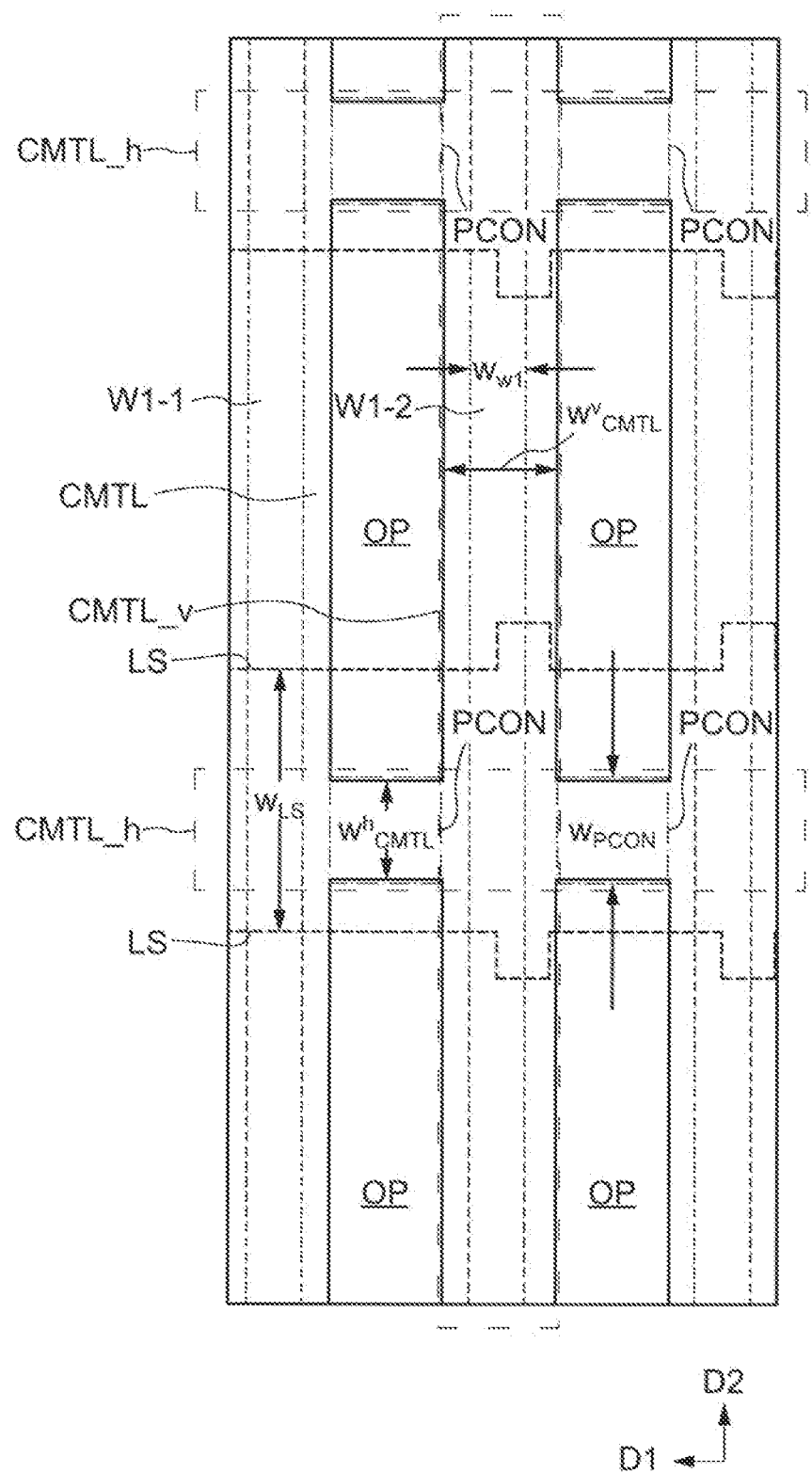
FIG. 17 is a plan view showing a width of each layer in a second direction in a display device according to an embodiment of the present invention.

FIG. 17 is a plan view showing the width of each layer in the second direction D2 in the display device 10 according to the embodiment of the present invention. In the following description, in order to explain the widths of the light shielding layer LS, the opening PCON, and the common auxiliary electrode CMTL in the second direction D2, FIG. 17 shows a plan view in which each layout of the light shielding layer LS, the opening PCON, and the common auxiliary electrode CMTL overlap each other.

The light shielding layer LS extending in the first direction D1 has a width $w_{LS}$ in the second direction D2. Further, the opening PCON overlapping the gate electrode GL1 has a width $W_{PCON}$ in the second direction D2. Although the common auxiliary electrode CMTL is provided in a grid pattern, it can be considered that the common auxiliary electrode CMTL extends linearly in each of the first direction D1 and the second direction D2 and is formed in a grid pattern. In other words, the common auxiliary electrode CMTL includes a plurality of horizontal grid portions CMTL_h which extends along the first direction D1 and is commonly provided in pixels arranged in the first direction D1 and a plurality of vertical grid portions CMTL_v which extends along the second direction D2 between two adjacent pixels and connects the plurality of horizontal grid portions CMTL_h. In this way, the horizontal grid portion CMTL_h of the common auxiliary electrode CMTL has a width $w^h_{CMTL}$ in the second direction D2. In other words, the width $w^h_{CMTL}$ is the distance between the two openings OP formed side by side in the second direction D2.

In a plan view, the light shielding layer LS overlaps the entire opening PCON. Therefore, the width was is larger than the width $W_{PCON}$. Further, both end edges of the horizontal grid portion CMTL_h of the common auxiliary electrode CMTL in the second direction D2 are located in the opening PCON. Therefore, the width $w_{CMTL}$ is smaller than the width $W_{PCON}$ (see also FIG. 4). That is, the light shielding layer LS, the opening PCON, and the common auxiliary electrode CMTL have a smaller width in the second direction D2 in this order.

In a plan view, the width $w^v_{CMTL}$ of the vertical grid portion CMTL_v of the common auxiliary electrode CMTL in the first direction D1 is larger than the width w1 of the first wiring W1-1 or the second wiring W1-2 which is a signal line.

As described above, the electrical resistance of the common auxiliary electrode CMTL is lower than the electrical resistance of the common electrode CTCO. Therefore, the time constant is reduced in the common electrode CTCO with which the common auxiliary electrode CMTL is in contact. Further, the auxiliary electrode CTML has a light shielding function. Therefore, part of the oxide semiconductor layer OS can be sandwiched between the light shielding layer LS and the common auxiliary electrode CMTL, and the light irradiation to the channel of the oxide semiconductor layer OS can be suppressed. Therefore, in the display device 10 including such a common auxiliary electrode CMTL, the characteristics of the transistor Tr1 are stable and the reliability is improved.

Further, as shown in FIG. 17, the display area (translucent area) of each pixel on the TFT substrate is defined by the edge of the light shielding layer LS in the first direction and by the edge of the common auxiliary electrode CMTL in the second direction. The light shielding layer LS and the common auxiliary electrode CMTL are formed by etching a metal layer, and the dimensional accuracy of the edge portion is extremely high. Therefore, even when the pixel is formed small in order to improve the definition of the display device 10, the display area of the pixels can be formed with high accuracy, and the variation between the pixels in the display area is suppressed. In this configuration, a configuration in which a black matrix for partitioning each pixel is provided on the counter substrate side where the color filter is provided may be applied. This configuration suppresses color mixing between pixels.

[First Modification]

Figure 18:
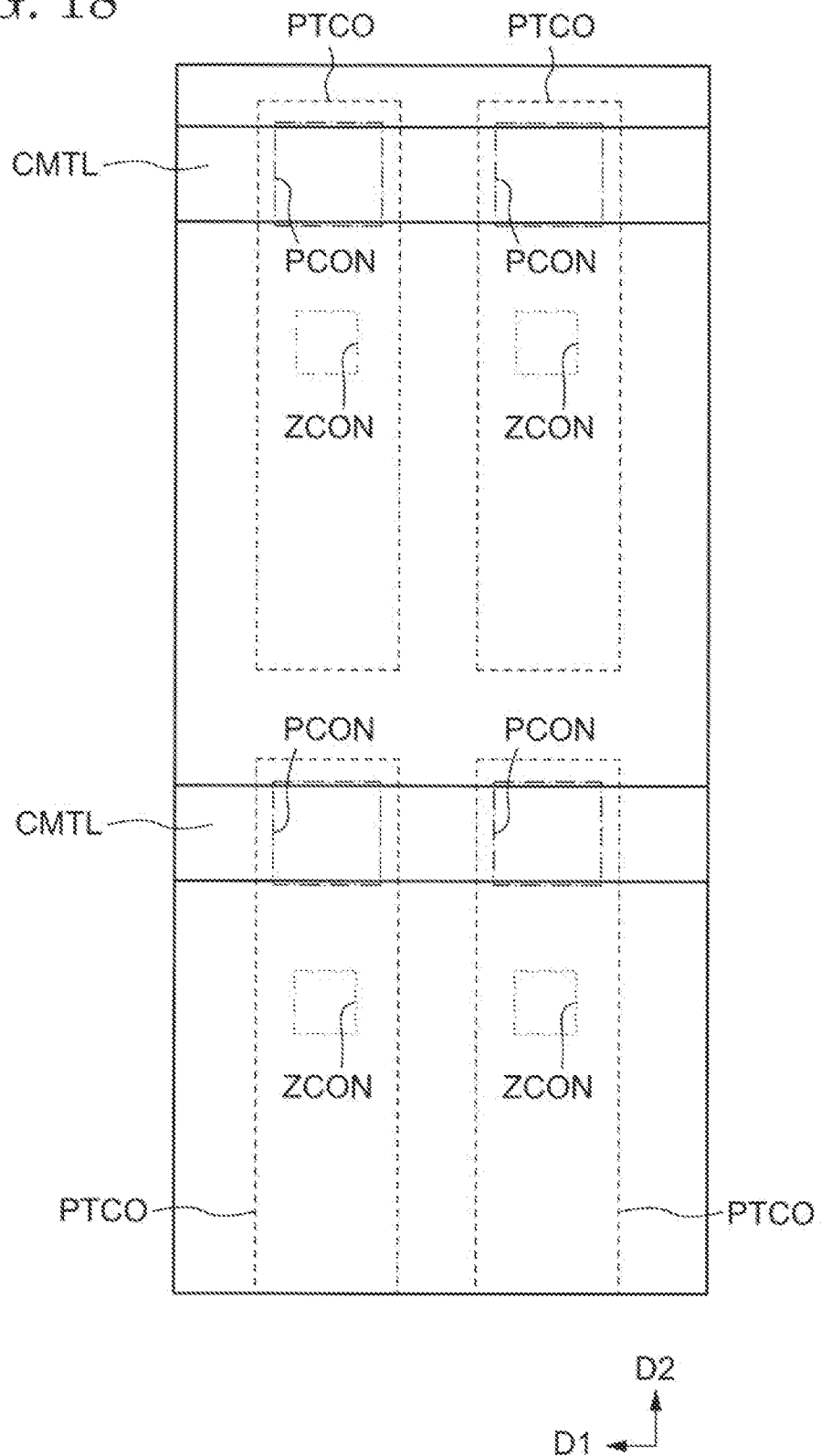
FIG. 18 is a plan view showing a layout of a modified common auxiliary electrode in a display device according to an embodiment of the present invention.

A modification of the display device 10 according to the embodiment of the present invention is described with reference to FIG. 18. FIG. 18 is a plan view showing a layout of the modified common auxiliary electrode CMTL in the display device 10 according to the embodiment of the present invention. As shown in FIG. 18, the common auxiliary electrode CMTL according to the First Modification is formed in a plurality of linear or strip shapes separated from each other in the image display area, overlaps the opening PCON of each pixel, and is provided to extend only in the first direction D1.

The common auxiliary electrode CMTL according to the First Modification is also in contact with the common electrode CTCO, and the time constant of the common electrode CTCO can be reduced. Further, the oxide semiconductor layer OS can be sandwiched between the light shielding layer LS and the common auxiliary electrode CMTL according to the First Modification, and the light irradiation to the channel of the oxide semiconductor layer OS can be suppressed.

[Second Modification]

Figure 19:
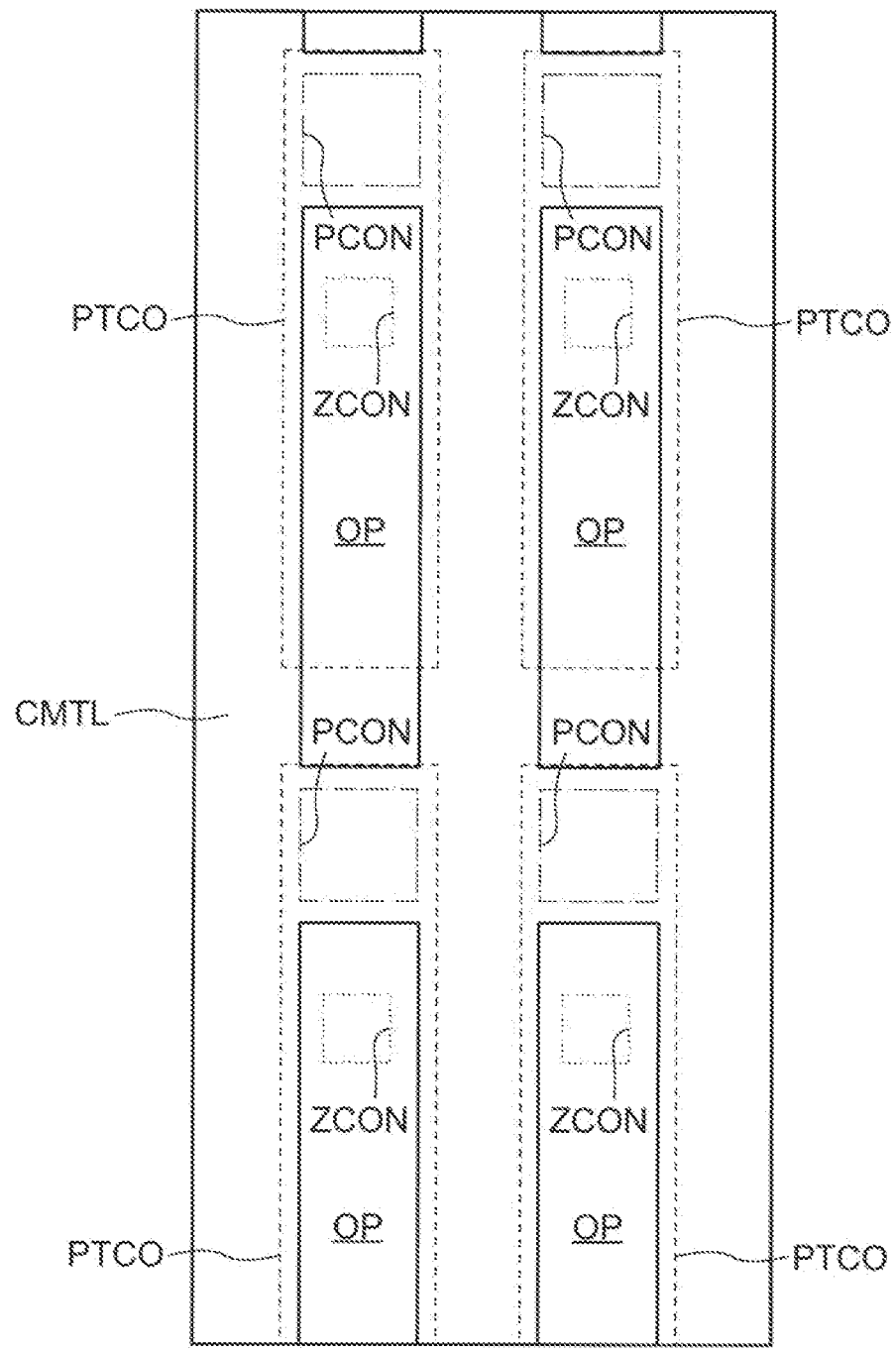
FIG. 19 is a plan view showing a layout of a modified common auxiliary electrode in a display device according to an embodiment of the present invention.
Figure 19:

Another modification of the display device 10 according to the embodiment of the present invention is described with reference to FIGS. 19, 20A, and 20B. FIG. 19 is a plan view showing a layout of a modified common auxiliary electrode CMTL in the display device 10 according to the embodiment of the present invention. Further, FIGS. 20A and 20B are plan views showing a width of each layer in the first direction D1 and the second direction D2 in the display device 10 according to the embodiment of the present invention.

As shown in FIG. 19, the common auxiliary electrode CMTL according to the Second Modification overlaps a part of each pixel electrode PTCO of the plurality of pixels and is provided in a grid pattern. Specifically, the common auxiliary electrode CMTL according to the Second Modification overlaps the opening PCON in the pixel and is commonly provided in a plurality of pixels. In other words, the common auxiliary electrode CMTL according to the Second Modification is opened so that the pixel electrode PTCO including the opening ZCON is exposed. That is, the opening ZCON (the first contact area CON1) is included in the display area.

Figure 20A:
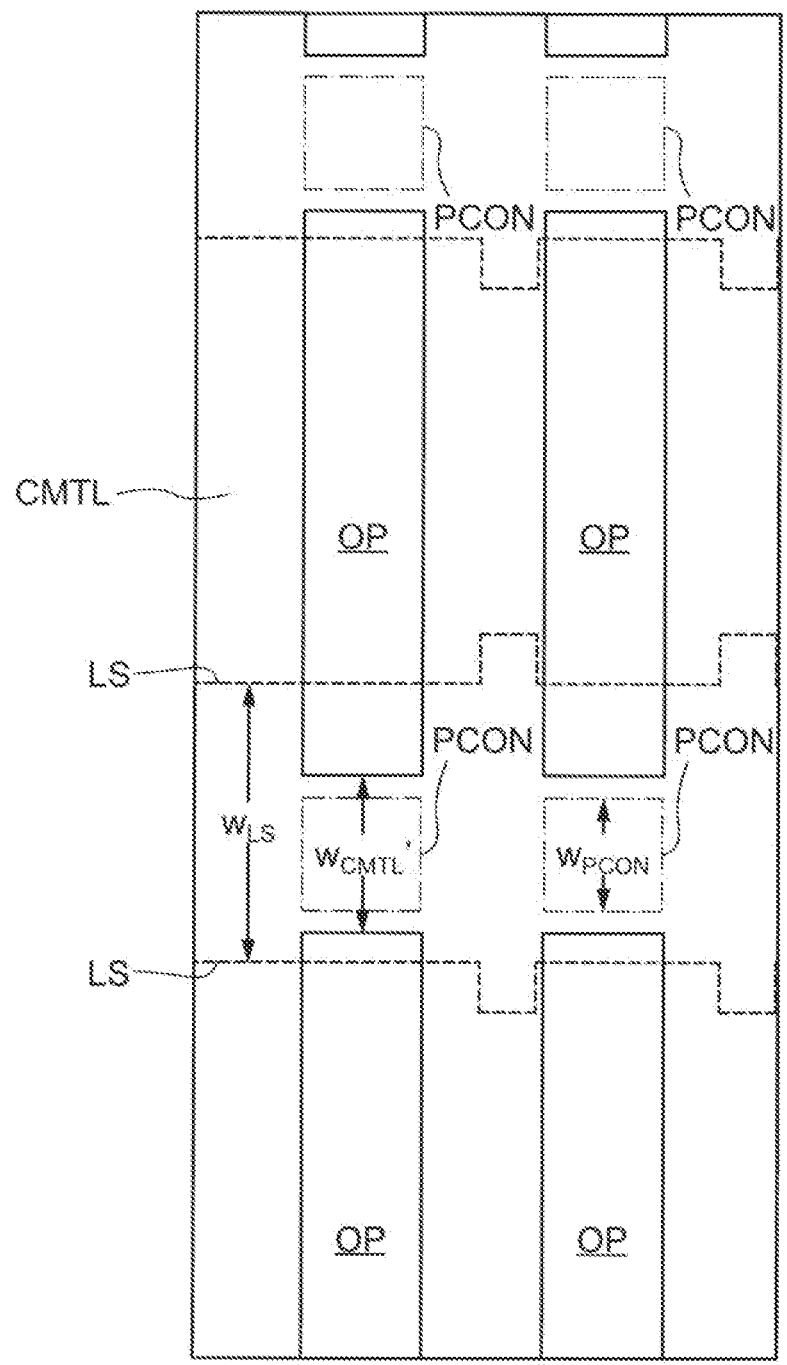
FIG. 20A is a plan view showing a width of each layer in a first direction and a second direction in a display device according to an embodiment of the present invention.
Figure 20B:
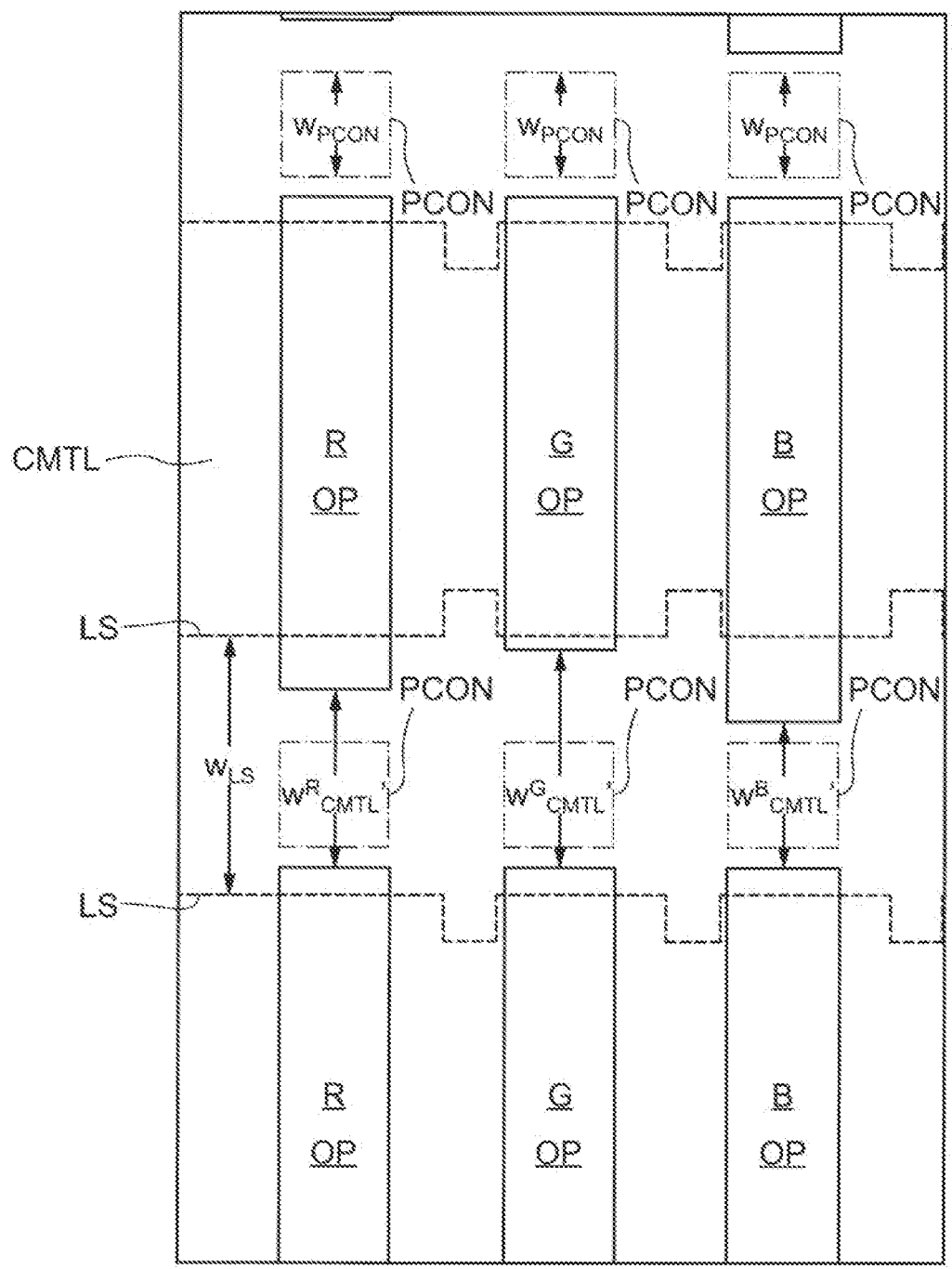
FIG. 20B is a plan view showing a width of each layer in a first direction and a second direction in a display device according to an embodiment of the present invention.

FIG. 20A shows a plan view in which the layouts of the light shielding layer LS, the opening PCON, and the common auxiliary electrode CMTL according to the Second Modification overlap each other. Although the common auxiliary electrode CMTL according to the Second Modification is provided in a grid pattern, it can be considered that the common auxiliary electrode CMTL according to the Second Modification extends linearly in each of the first direction D1 and the second direction D2 to form a grid pattern. In this way, the common auxiliary electrode CMTL has a width $w_{CMTL}'$ in the second direction D2. In other words, the width $w_{CMTL}'$ is the distance between the openings OP in the second direction.

In a plan view, the light shielding layer LS overlaps the entire opening PCON. Therefore, the width was is larger than the width $w_{PCON}$. Further, the common auxiliary electrode CMTL according to the Second Modification is provided so as to cover the opening PCON. More specifically, in a plan view, the entirety of the outermost peripheral edge of the opening PCON overlaps the common auxiliary electrode CMTL. Therefore, the width $w_{CMTL}'$ is larger than the width $w_{PCON}$. However, the width $w_{CMTL}'$ is smaller than the width $w_{LS}$. Therefore, the light shielding layer LS, the common auxiliary electrode CMTL according to the Second Modification, and the opening PCON have a smaller width in the second direction D2 in this order.

The common auxiliary electrode CMTL according to the Second Modification is also in contact with the common electrode CTCO, and the time constant of the common electrode CTCO can be reduced. Further, the oxide semiconductor layer OS can be sandwiched between the light shielding layer LS and the common auxiliary electrode CMTL according to the Second Modification, and the light irradiation to the channel of the oxide semiconductor layer OS can be suppressed.

In addition, in the display device 10, the aperture ratio of the pixel 310 can be adjusted by changing the width of the common auxiliary electrode CMTL in the second direction D2. The red pixel R, the green pixel G, and the blue pixel B may have different widths of the common auxiliary electrode CMTL in the second direction D2. For example, as shown in FIG. 20B, the width $w^B_{CMTL}'$ of the common auxiliary electrode CMTL in a line of the blue pixel B in the second direction D2 can be smaller than the widths $w^R_{CMTL}'$ and $w^G_{CMTL}'$ of the common auxiliary electrode CMTL in a line of the red pixel R and a line of the green pixel G in the second direction. That is, as shown in FIG. 20B, the widths $w^R_{CMTL}'$ and $w^G_{CMTL}'$ of the common auxiliary electrode CMTL in the red pixel R and the green pixel G in the second direction are smaller than the width $w^B_{CMTL}'$ of the common auxiliary electrode CMTL in the blue pixel B in the second direction D2 to have a difference in the size of each opening OP. Further, the width $w^G_{CMTL}'$ of the common auxiliary electrode CMTL in the line of the green pixel G in the second direction can be smaller than the width $w^R_{CMTL}'$ of the common auxiliary electrode CMTL in the line of the red pixel R in the second direction D2. Although these widths $w^R_{CMTL}'$, $w^G_{CMTL}'$, and $w^B_{CMTL}'$ are smaller than the width $w_{LS}$ of the light shielding layer LS located in the lower layer, the amount of light diffracted by the light shielding layer LS can be further adjusted. Therefore, the transmittance can be finely adjusted for each pixel.

[Third Modification]

Figure 21:
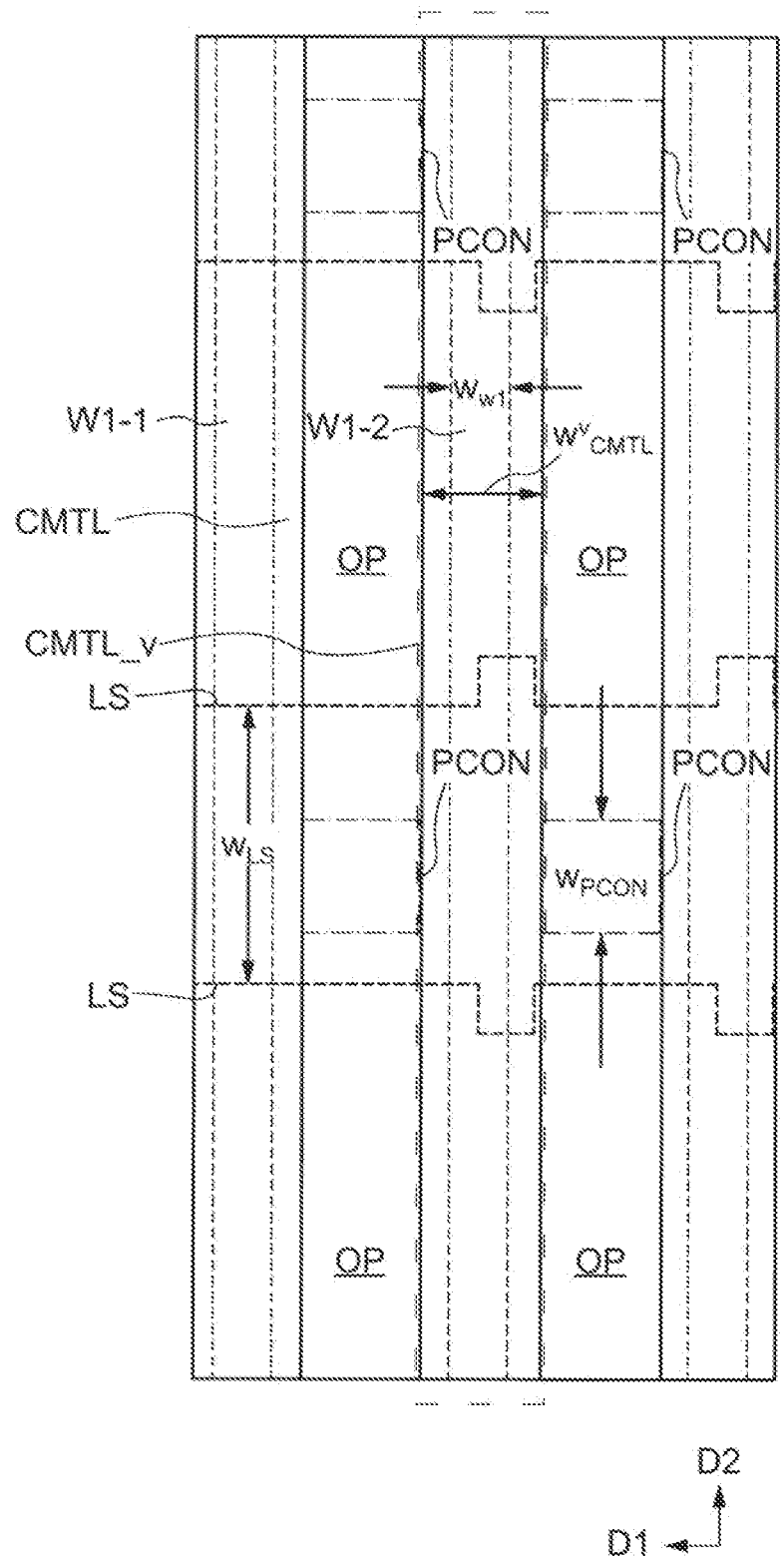
FIG. 21 is a plan view showing a width of each layer in a first direction in a display device according to an embodiment of the present invention.

A modification of the display device according to the embodiment of the present invention is described with reference to FIG. 21. FIG. 21 is a plan view showing a width of each layer in the first direction D1 in the display device according to the embodiment of the present invention. In the common auxiliary electrode CMTL shown in FIG. 21, only the vertical grid portion CMTL_v is provided, and the horizontal grid portion CMTL_h is not provided. In this case, the display area of each pixel is defined by the light shielding layer LS extending in the direction D1 and the vertical grid portion CMTL_v extending in the direction D2.

As described above, in the display device 10 according to the present embodiment including the First Modification and the Second Modification, the common auxiliary electrode CMTL is provided in the opening PCON. The common auxiliary electrode CMTL is in contact with the common electrode CTCO, and the time constant of the common electrode CTCO can be reduced. Further, the common auxiliary electrode CMTL has a light shielding function and can suppress light irradiation to the channel of the oxide semiconductor layer OS. Therefore, in the display device 10 including such a common auxiliary electrode CMTL, the characteristics of the transistor Tr1 are stable and the reliability is improved.

Further, in the display device 10, the conduction between the oxide semiconductor layer OS of the transistor Tr1 and the connection electrode ZTCO can be ensured by being directly in contact with each other. Therefore, it is not necessary to provide a metal layer between the oxide semiconductor layer OS and the connection electrode ZTCO. Therefore, since the opening ZCON (the first contact area CON1) is not shielded from light, the decrease in the aperture ratio can be suppressed. Further, since the oxide semiconductor layer OS has translucency, in the present embodiment, the oxide semiconductor layer OS is exposed in the opening area of the pixel, but the light from the backlight passes through the oxide semiconductor layer OS. Therefore, the decrease in the transmittance of the opening area due to the exposure of the oxide semiconductor layer OS to the opening area is reduced as much as possible. Further, since the layer exposed to the display area has translucency and is an oxide semiconductor layer OS such as a silicon layer in which unevenness of transmitted light is unlikely to occur, the occurrence of unevenness in display can be suppressed.

Second Embodiment

Figure 22:
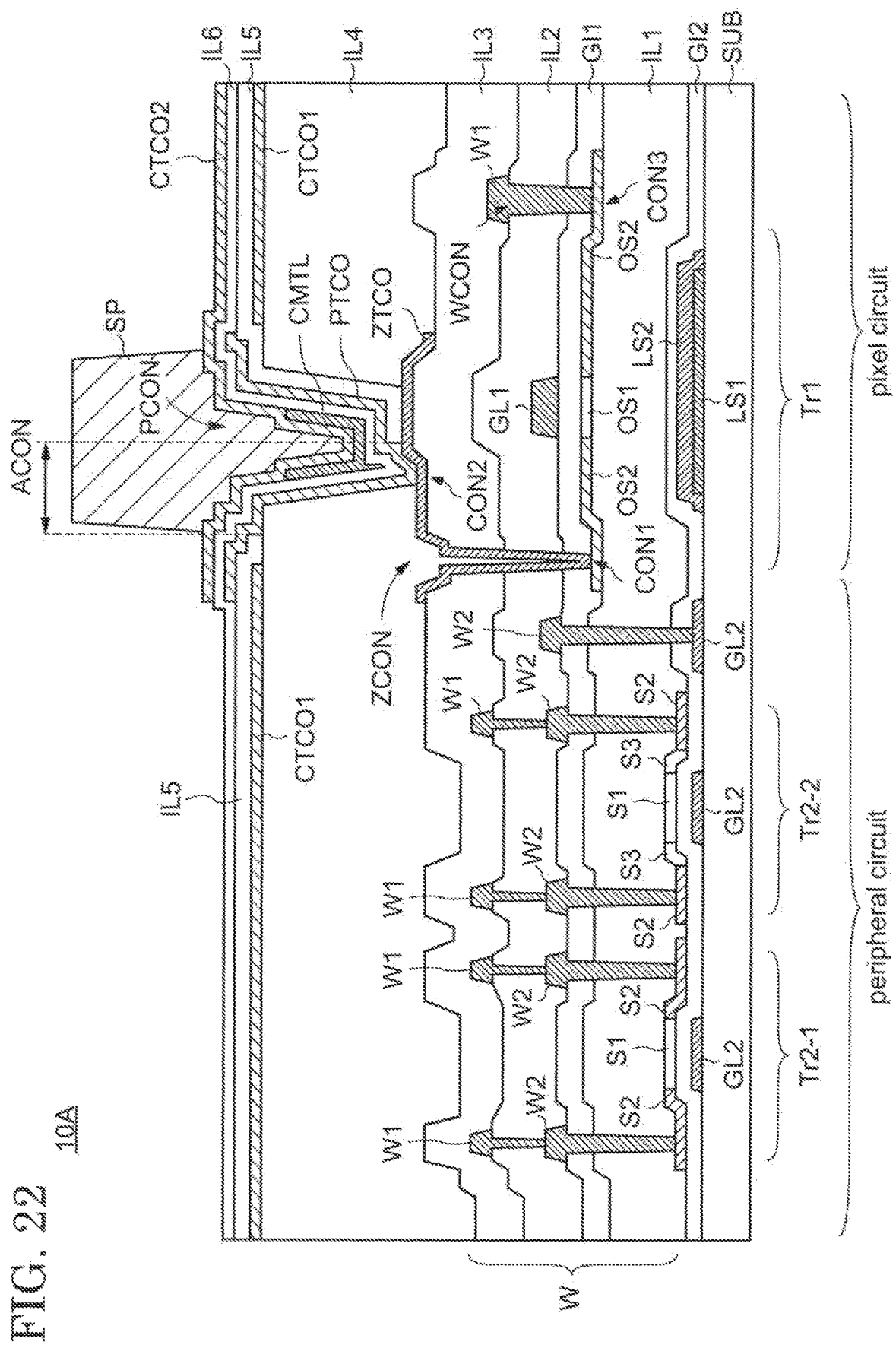
FIG. 22 is a cross-sectional view showing a configuration of a display device according to an embodiment of the present invention.

A configuration of a display device 10A according to an embodiment of the present invention is described with reference to FIG. 22. FIG. 22 is a cross-sectional view showing a configuration of the display device 10A according to the embodiment of the present invention. The cross-sectional view of FIG. 22 is for explaining the layer structure of the display device 10A, and the peripheral circuit and the pixel circuit are shown adjacent to each other. Needless to say, however, the pixel circuit is provided in the image display area and the peripheral circuits is provided in the frame area outside the image display area, and these circuits are provided apart from each other. Further, in particular, in the pixel circuit in FIG. 22, the peripheral portion of a contact hole in the pixel is mainly shown, and only a part of the translucent area (opening area) that contributes to the display is shown. When the configuration of the display device 10A is the same as the configuration of the display device 10, the description thereof may be omitted.

In the display device 10A, the common electrode CTCO1 is provided on the insulating layer IL4. Although FIG. 22 illustrates a configuration in which the common electrode CTCO1 is provided in the drive circuit, the common electrode CTCO1 is also provided in the pixels. The insulating layer IL5 is provided on the common electrode CTCO1. The pixel electrode PTCO is provided on the insulating layer IL5. Although omitted in the drawings, the common electrode CTCO1 overlaps the pixel electrode PTCO via the insulating layer IL5, whereby the common electrode CTCO1, the insulating layer IL5, and the pixel electrode PTCO form a holding capacity. The pixel electrode PTCO is connected to the connection electrode ZTCO via the opening ACON provided in the insulating layer IL5 and the opening PCON provided in the insulating layer IL4. The area where the connection electrode ZTCO and the pixel electrode PTCO are in contact with each other is referred to as a second contact area CON2. The second contact area CON2 is provided in the area where the opening PCON and the opening ACON overlap each other. In a plan view, the second contact area CON2 overlaps the gate electrode GL1.

The pixel electrode PTCO is a transparent conductive layer. The insulating layer IL6 is provided on the pixel electrode PTCO. Here, the film thickness of the insulating layer IL6 is smaller than the film thickness of the insulating layer IL5. The film thickness of the insulating layer IL6 may be substantially the same as the film thickness of the insulating layer IL5.

A common auxiliary electrode CMTL and a common electrode CTCO2 are provided on the insulating layer IL6. Although the details are described later, the common auxiliary electrode CMTL and the common electrode CTCO2 have different planar patterns. The common auxiliary electrode CMTL is a metal layer. The common electrode CTCO2 is a transparent conductive layer. The common electrode CTCO2 and the common auxiliary electrode CMTL overlap the pixel electrode PTCO via the insulating layer IL6. More specifically, the common electrode CTCO2 and the common auxiliary electrode CMTL overlap the pixel electrode PTCO at the bottom of the opening area (the opening PCON and the opening ACON), that is, at a position closer to the second contact area CON2 than the common electrode CTCO1. Although it is omitted in the drawings, the common electrode CTCO2 overlaps the pixel electrode PTCO and the common electrode CTCO1 even in the display area (the translucent area). Therefore, a holding capacity is formed by the common electrode CTCO2, the common auxiliary electrode CMTL, the insulating layer IL6, and the pixel electrode PTCO. The electrical resistance of the common auxiliary electrode CMTL is lower than the electrical resistance of the common electrode CTCO2. Further, the common auxiliary electrode CMTL also functions as a light shielding layer, and for example, it is possible to suppress color mixing from occurring by blocking light from adjacent pixels. Furthermore, the common electrode CTCO2 is electrically connected to the common electrode CTCO1 in the peripheral area. A spacer SP is provided on the common electrode CTCO2. The spacer SP overlaps at least the second contact area CON2 and fills the second contact area CON2. The spacer SP may overlap the gate electrode GL1 and the pixel electrode PTCO.

The display device 10A according to the present embodiment also has a common auxiliary electrode CMTL provided in the opening PCON. The common auxiliary electrode CMTL is in contact with the common electrode CTCO, and the time constant of the common electrode CTCO can be reduced. Further, the common auxiliary electrode CMTL has a light shielding function and can suppress light irradiation to the channel of the oxide semiconductor layer OS. Therefore, in the display device 10A including such a common auxiliary electrode CMTL, the characteristics of the transistor Tr1 are stable and the reliability is improved.

Further, in the display device 10A, in the display area of the pixel 310, it is possible to add the holding capacity by the pixel electrode PTCO, the insulating layer IL5, and the common electrode CTCO1 to the holding capacity by the pixel electrode PTCO, the insulating layer IL6, and the common electrode CTCO2 (and the common auxiliary electrode CMTL). Since the holding capacity in the display device 10A can be increased, the influence of the potential due to the capacitive coupling can be reduced. Therefore, in the display device 10A, the influence of the potential due to the capacitive coupling can be reduced in the reduced pixels, so that the crosstalk can be reduced.

Furthermore, in the display device 10A, the common electrode CTCO1 is also formed above the peripheral circuit, whereby the intrusion of external noise into the peripheral circuit is suppressed.

Third Embodiment

Figure 23:
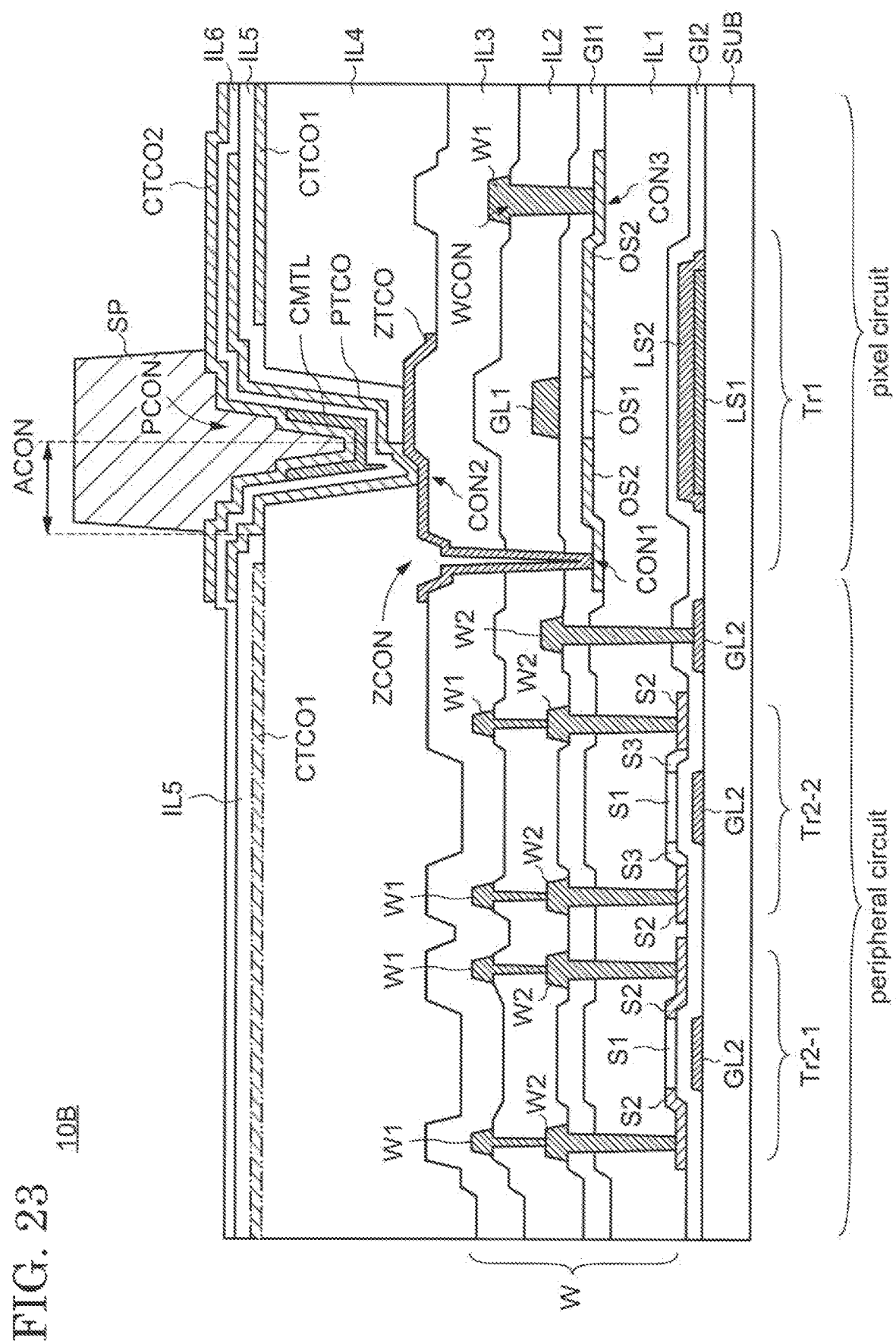
FIG. 23 is a cross-sectional view showing a configuration of a display device according to an embodiment of the present invention.

A configuration of a display device 10B according to an embodiment of the present invention is described with reference to FIG. 23. FIG. 23 is a cross-sectional view showing a configuration of the display device 10B according to the embodiment of the present invention. When the configuration of the display device 10B is the same as the configuration of the display device 10A, the description of the configuration of the display device 10B may be omitted.

In the display device 10B, the pixel electrode PTCO is provided so as to overlap the common electrode CTCO1 provided in the pixel circuit via the insulating layer IL5. Further, the pixel electrode PTCO is provided so as to overlap the common electrode CTCO2 via the insulating layer IL6.

In the display device 10B, the common electrode CTCO1 may or may not be provided in the peripheral circuit. That is, the common electrode CTCO1 may be provided at least in the pixel circuit. Further, even when the common electrode CTCO1 is provided in the peripheral circuit, the common electrode CTCO1 provided in the peripheral circuit and the CTCO1 provided in the pixel circuit are separated from each other. Therefore, a potential different from the potential supplied to the common electrode CTCO1 provided in the pixel circuit (for example, GND) may be supplied to the common electrode CTCO1 provided in the peripheral circuit. Therefore, the intrusion of external noise into the peripheral circuit is suppressed.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on the respective embodiments are also included within the scope of the present invention as long as the gist of the present invention is provided.

Other effects of the action which differ from those brought about by each of the above described embodiments, but which are apparent from the description herein or which can be readily predicted by those skilled in the art, are naturally understood to be brought about by the present invention.

What is claimed is:

1. A display device comprising a plurality of pixels arranged in a matrix on a substrate along a first direction and a second direction intersecting the first direction,
   wherein each of the plurality of pixels comprises:
      a transistor;
      a first transparent electrode located over the transistor and electrically connected to the transistor;
      a second transparent electrode located over the first transparent electrode and electrically connected to the first transparent electrode via an opening;
      an insulating layer located over the second transparent electrode;
      a third transparent electrode located over the insulating layer; and
      a metal layer in contact with the third transparent electrode,
   the opening overlaps a gate electrode of the transistor,
   at least a part of the metal layer is provided in the opening and overlaps the gate electrode, and
   the metal layer extends along the first direction and is commonly provided in the pixels arranged in the first direction.

2. The display device according to claim 1, wherein the metal layer further extends along the second direction between two adjacent pixels in the first direction.

3. The display device according to claim 1, wherein the metal layer covers the opening.

4. The display device according to claim 1, wherein both edge portions in the second direction of the metal layer are included in the opening.

5. The display device according to claim 1,
   wherein each of the plurality of pixels further comprises a light shielding layer located below the transistor, and
   at least a part of the metal layer overlaps the light shielding layer.

6. The display device according to claim 5, wherein the light shielding layer extends along the first direction and is commonly provided in the pixels arranged in the first direction.

7. The display device according to claim 6, wherein a width of the metal layer in the second direction is less than a width of the light shielding layer in the second direction.

8. The display device according to claim 7, wherein the transistor comprises an oxide semiconductor layer.

9. The display device according to claim 1,
   wherein the plurality of pixels comprises a red pixel, a green pixel, and a blue pixel, and
   widths of the metal layer in the second direction corresponding to the red pixel, the green pixel and the blue pixel are different.

10. The display device according to claim 9, wherein a width of the metal layer in the second direction in the blue pixel is smaller than a width of the metal layer in the second direction in each of the red pixel and the green pixel.

11. The display device according to claim 10, wherein the transistor comprises an oxide semiconductor layer.

12. An array substrate of a display device comprising a plurality of pixel circuits arranged in a first direction on a substrate,
    wherein each of the plurality of pixel circuits comprises:
       a transistor;
       a first transparent electrode located over the transistor and electrically connected to the transistor;
       a second transparent electrode located over the first transparent electrode and electrically connected to the first transparent electrode via an opening;
       an insulating layer located over the second transparent electrode;
       a third transparent electrode located over the insulating layer; and
       a metal layer in contact with the third transparent electrode,
    the metal layer extends along the first direction in a plan view and passes over the opening of a first pixel circuit and the opening of a second pixel circuit adjacent to the first pixel circuit, and
    both edge portions of the metal layer in a second direction intersecting the first direction are included in the opening.

13. The array substrate of the display device according to claim 12,
    wherein the transistor comprises a gate electrode, and
    the metal layer overlaps the gate electrode.

14. The array substrate of the display device according to claim 12, wherein the metal layer further extends along the second direction intersecting the first direction between the first pixel circuit and the second circuit.

15. The array substrate of the display device according to claim 12, wherein the metal layer covers the opening.

16. The array substrate of the display device according to claim 12, further comprising a plurality of pixels each having a corresponding one of the pixel circuits,
   wherein each of the plurality of pixels further comprises a light shielding layer located below the transistor, and at least a part of the metal layer overlaps the light shielding layer.

17. The array substrate of the display device according to claim 16, wherein the light shielding layer extends along the first direction and is commonly provided in the pixels arranged in the first direction.

18. The array substrate of the display device according to claim 17, wherein a width of the metal layer in the second direction is less than a width of the light shielding layer in the second direction.

19. The array substrate of the display device according to claim 18, wherein the transistor comprises an oxide semiconductor layer.

20. The array substrate of the display device according to claim 12, further comprising a plurality of pixels each having a corresponding one of the plurality of pixel circuits,
   wherein the plurality of pixels comprises a red pixel, a green pixel, and a blue pixel, and
   widths of the metal layer in the second direction corresponding to the red pixel, the green pixel and the blue pixel are different.

21. The array substrate of the display device according to claim 20, wherein a width of the metal layer in the second direction in the blue pixel is smaller than a width of the metal layer in the second direction in each of the red pixel and the green pixel.

22. The array substrate of the display device according to claim 21, wherein the transistor comprises an oxide semiconductor layer.

23. An array substrate of a display device comprising
   a plurality of pixel circuits arranged in a first direction on a substrate; and
   a plurality of pixels each having a corresponding one of the plurality of pixel circuits,
   wherein each of the plurality of pixel circuits comprises:
      a transistor;
      a first transparent electrode located over the transistor and electrically connected to the transistor;
      a second transparent electrode located over the first transparent electrode and electrically connected to the first transparent electrode via an opening;
      an insulating layer located over the second transparent electrode;
      a third transparent electrode located over the insulating layer; and
      a metal layer in contact with the third transparent electrode,
   the metal layer extends along the first direction in a plan view and passes over the opening of a first pixel circuit and the opening of a second pixel circuit adjacent to the first pixel circuit,
   the plurality of pixels comprises a red pixel, a green pixel, and a blue pixel, and
   widths of the metal layer in the second direction corresponding to the red pixel, the green pixel and the blue pixel are different,
   a width of the metal layer in the second direction in the blue pixel is smaller than a width of the metal layer in the second direction in each of the red pixel and the green pixel, and
   the transistor comprises an oxide semiconductor layer.

* * * * *